US012376419B2

(12) United States Patent
Escarra et al.

(10) Patent No.: US 12,376,419 B2
(45) Date of Patent: Jul. 29, 2025

(54) SPECTRUM-SPLITTING CONCENTRATOR PHOTOVOLTAIC MODULE WITH DIRECT FLUID COOLING, AND ASSOCIATED METHODS

(71) Applicant: THE ADMINISTRATORS OF THE TULANE EDUCATIONAL FUND, New Orleans, LA (US)

(72) Inventors: Matthew David Escarra, New Orleans, LA (US); Kazi M. Islam, New Orleans, LA (US); Yaping Ji, New Orleans, LA (US); Daniel Codd, New Orleans, LA (US); David M. Bar-Or, New Orleans, LA (US); Jacqueline C. Failla, New Orleans, LA (US); Claire C. Davis, New Orleans, LA (US); Maxwell W. Woody, New Orleans, LA (US)

(73) Assignee: THE ADMINISTRATORS OF THE TULANE EDUCATIONAL FUND, New Orleans, LA (US)

( * ) Notice: Subject to any disclaimer, the term of this patent is extended or adjusted under 35 U.S.C. 154(b) by 0 days.

(21) Appl. No.: 17/619,187

(22) PCT Filed: Jun. 14, 2020

(86) PCT No.: PCT/US2020/037664
§ 371 (c)(1),
(2) Date: Dec. 14, 2021

(87) PCT Pub. No.: WO2020/252432
PCT Pub. Date: Dec. 17, 2020

(65) Prior Publication Data
US 2022/0310864 A1     Sep. 29, 2022

Related U.S. Application Data

(60) Provisional application No. 62/861,769, filed on Jun. 14, 2019.

(51) Int. Cl.
  *H10F 77/42*     (2025.01)
  *H10F 19/10*     (2025.01)
  (Continued)

(52) U.S. Cl.
  CPC .......... *H10F 77/492* (2025.01); *H10F 19/10* (2025.01); *H10F 77/68* (2025.01); *H02S 40/22* (2014.12)

(58) Field of Classification Search
  CPC .............. H01L 31/054; H01L 31/0549; H01L 31/0521; H01L 31/047; H02S 40/22; H01G 9/2077
  See application file for complete search history.

(56) References Cited

U.S. PATENT DOCUMENTS 6,583,349 B2 *  6/2003  Tanaka ................ H01L 31/0543
                                                     136/246
2006/0260605 A1 * 11/2006 Connor ............... H01L 31/0547
                                                     126/561
(Continued)

FOREIGN PATENT DOCUMENTS

JP        2009255882 A   * 11/2009
WO   WO 2015/120367 A1    8/2015
(Continued)

OTHER PUBLICATIONS

J. Rheims et al., "Refractive-index measurements in the near-IR using an Abbe refractometer", Measurement Science and Technology 8, p. 601 (Year: 1997).*
(Continued)

*Primary Examiner* — Ryan S Cannon
(74) *Attorney, Agent, or Firm* — Cozen O'Connor

(57) ABSTRACT

A spectrum-splitting concentrator photovoltaic (CPV) module utilizes direct fluid cooling of photovoltaic cells in which an array of photovoltaic cells is fully immersed in a flowing
(Continued)

heat transfer fluid. Specifically, at least a portion of both the front face and the rear face of each photovoltaic cell comes into direct contact with heat transfer fluid, thereby enhancing coupling of waste heat out of the photovoltaic cells and into the heat transfer fluid. The CPV module is designed to maximize transmission of infrared light not absorbed by the photovoltaic cells, and therefore may be combined with a thermal receiver that captures the transmitted infrared light as part of a hybrid concentrator photovoltaic-thermal system.

11 Claims, 17 Drawing Sheets

(51) Int. Cl.
*H10F 77/63* (2025.01)
*H02S 40/22* (2014.01)

(56) References Cited

U.S. PATENT DOCUMENTS

| | | | |
|---|---|---|---|
| 2007/0034207 A1 | 2/2007 | Niedermeyer | |
| 2007/0125420 A1* | 6/2007 | Ezure | H01G 9/2077 136/263 |
| 2008/0029151 A1* | 2/2008 | McGlynn | H01L 31/0735 136/249 |
| 2012/0024283 A1 | 2/2012 | Skillman | |
| 2012/0291851 A1* | 11/2012 | Zhu | H01L 31/0521 136/246 |
| 2013/0042902 A1 | 2/2013 | Yang et al. | |
| 2015/0325734 A1 | 11/2015 | Pisharodi | |
| 2016/0118930 A1* | 4/2016 | Chun | H02S 40/22 136/246 |
| 2016/0204296 A1 | 7/2016 | Zhu et al. | |

FOREIGN PATENT DOCUMENTS

| | | | | |
|---|---|---|---|---|
| WO | WO-2017172841 A1 | * | 10/2017 | ........... H01L 31/048 |
| WO | WO 2018/224962 A1 | | 12/2018 | |

OTHER PUBLICATIONS

International Patent Application No. PCT/US2020/037664, International Search Report and Written Opinion dated Oct. 5, 2020, 11 pgs.

Han et al., Investigations of III-V concentrator solar cells with liquid immersion for high concentrating photovoltaic systems, Elsevier Solar Energy 158, 2017, pp. 728-736.

Zhu et al., An effective heat dissipation method for densely packed solar cells under high concentrations, Elsevier Solar Energy Materials & Solar Cells 94, 2010, pp. 133-140.

Han et al., Electrical and thermal performance of silicon concentrator solar cells immersed in dielectric liquids, Elsevier Applied Energy 88, 2011, pp. 4481-4489.

Sun et al., Direct liquid-immersion cooling of concentrator silicon solar cells in a linear concentrating photovoltaic receiver, Elsevier Energy 65, 2014, pp. 264-271.

Abdollahi et al., Heat transfer enhancement in a hybrid PV cell-cooling tower, Heat Mass Transfer, 2019, pp. 2355-2363.

Kang et al., Experiment and Simulation Study on Silicon Oil Immersion Cooling Densely-Packed Solar Cells Under High Concentration Ratio, International Journal of Energy and Power Engineering, vol. 5 Issue 3, Jun. 2016, pp. 90-96.

Han et al., Thermal Analysis of Direct Liquid-Immersed Solar Receiver for High Concentrating Photovoltaic System, International Journal of Photoenergy, vol. 2015, 2015, 9 pages.

* cited by examiner

| Physical parameter | Unit | Glycols | Mineral oils | Synthetic oils | Silicone oils |
|---|---|---|---|---|---|
| Refractive index | / | 1.432 | 1.475 | | 1.402 |
| Dielectric constant | / | 41.4 | 2.2 | 3.35 | 2.75 |
| Density | kg/m³ | 1038-1049 | 850-881 | 971-1064 | 913-957 |
| Thermal conductivity | W/m·K | 0.164-0.206 | 0.124-0.136 | 0.121-0.136 | 0.110-0.151 |
| Specific heat capacity | J/g·K | 1.87-2.51 | 1.88-2.14 | 1.57-1.70 | 1.50-1.64 |
| Operation temperature | °C | up to 260 | up to 315 | up to 400 | up to 400 |
| Viscosity | mPa·s | 3.11-5.07 | 22.7-65.9 | 3.57-5.56 | 1.58 – 48.8 |
| Cost | / | Moderate | Low | Highest | High |
| Toxicity | / | Non-hazardous | Non-hazardous | Hazardous | Non-hazardous |

FIG. 11

| Test date | Average suns | Power on cell regions | Power on bypass w/PDMS region | Power on bypass w/oil region | Expected transmitted power | TR_inlet | TR_outlet | TR_mfr | Power absorbed in TR | Measured transmitted power | Power lost fraction |
|---|---|---|---|---|---|---|---|---|---|---|---|
| | | W | W | W | W | °C | °C | g/s | W | W | % |
| 11/14/2019 | 70 | 30 | 134 | 99 | 202.4 | 25.1 | 55.6 | 1.2 | 152.0 | 165.2 | 18.4 |
| 11/25/2019 | 54 | 24 | 105 | 77 | 157.5 | 24.9 | 46.3 | 1.2 | 106.7 | 116.0 | 26.3 |
| 12/6/2019 | 110 | 48 | 214 | 157 | 322.0 | 18.6 | 71.1 | 1.2 | 262.4 | 285.2 | 11.5 |
| 12/15/2019 | 153 | 67 | 314 | 208 | 452.2 | 23.0 | 126.6 | 0.8 | 340.4 | 370.0 | 18.5 |
| 12/15/2019 | 153 | 67 | 315 | 209 | 453.5 | 22.4 | 171.2 | 0.6 | 351.2 | 381.8 | 15.8 |
| 12/16/2019 | 166 | 72 | 341 | 226 | 491.8 | 18.8 | 180.1 | 0.6 | 379.6 | 412.6 | 16.1 |
| 1/2/2020 | 157 | 69 | 324 | 214 | 466.3 | 23.5 | 173.1 | 0.6 | 351.2 | 381.8 | 18.1 |

Note: TR = thermal receiver

*FIG. 16*

| Date | Average suns | PV power W | PV fraction % | Cooling power W | Cooling fraction % | TR power W | TR fraction % | Total power W | Total fraction % | T_max measured °C |
|---|---|---|---|---|---|---|---|---|---|---|
| 11/14/2019 | 70 | 8.2 | 3.1% | 70.3 | 26.6% | 152.0 | 57.6% | 230.4 | 87.3% | 58.1 |
| 11/25/2019 | 54 | 5.8 | 2.8% | 70.0 | 34.1% | 106.7 | 52.0% | 182.5 | 88.9% | 47.8 |
| 12/6/2019 | 110 | 12.0 | 2.7% | 130.6 | 29.5% | 262.4 | 59.3% | 405.0 | 91.5% | 88.2 |
| 12/15/2019 | 153 | 11.6 | 2.0% | 153.8 | 26.1% | 340.4 | 57.8% | 505.8 | 86.0% | 111.2 |
| 12/15/2019 | 153 | 10.9 | 1.9% | 156.1 | 26.4% | 351.2 | 59.5% | 518.3 | 87.8% | 105.0 |
| 12/16/2019 | 166 | 12.7 | 2.0% | 158.4 | 24.8% | 379.6 | 59.3% | 550.6 | 86.1% | 118.7 |
| 1/2/2020 | 157 | 9.3 | 1.5% | 155.1 | 25.6% | 351.2 | 57.9% | 515.7 | 85.0% | 117.2 |

Note: TR = thermal receiver

*FIG. 20*

SPECTRUM-SPLITTING CONCENTRATOR PHOTOVOLTAIC MODULE WITH DIRECT FLUID COOLING, AND ASSOCIATED METHODS

CROSS-REFERENCE TO RELATED APPLICATION

This application is a 35 U.S.C. § 371 filing of International Application No. PCT/US2020/037664 filed Jun. 14, 2020, which claims priority to U.S. provisional patent application No. 62/861,769, titled "Direct Fluid Cooling for a Transmissive, Concentrated, Hybrid, Photothermal/Photovoltaic Solar System" and filed Jun. 14, 2019, the entirety of which is incorporated herein by reference.

STATEMENT REGARDING FEDERALLY SPONSORED RESEARCH OR DEVELOPMENT

The invention was made with U.S. government support under grant number ARPA-E DE-AR0000473 from the U.S. Department of Energy and the Advanced Research Projects Agency. The United States government has certain rights in the invention.

BACKGROUND

Fossil fuels, including coal, oil, and natural gas, are currently the world's primary energy source. Formed from organic material over the course of millions of years, fossil fuels are finite resources categorized as non-renewable energy resources. According to the U.S. Energy Information Administration, the burning of fossil fuels was responsible for 76% of U.S. greenhouse-gas emission in 2017. These gases contribute to the greenhouse effect and could lead to potentially catastrophic changes in the Earth's climate. Problems with fossil fuels are related not only to global warming, but also to such environmental concerns as air pollutions, acid precipitation, and ozone depletion.

Renewable energy sources and technologies provide for sustainable energy development and avoid the impending shortage of fossil fuels. Renewable energy is derived from resources that are replenished naturally on a human timescale. Such resources include biomass, geothermal heat, sunlight, water, and wind. All of these sources are essential components of a nation's energy strategy because of concerns not only for the local and global greenhouse gas emissions, but also for energy security and sustainability. The potential for renewable sources is enormous as they, in theory, can produce many times the world's total energy demand. In the past thirty years, a variety of renewable energy technologies and energy efficiency measures has led to overall cost savings, making the displacement of fossil fuels possible with minimal increase in cost. Among these technologies, solar energy is a promising renewable energy resource that can be utilized in many places throughout the world.

SUMMARY

Solar energy can be converted into electrical energy through the photovoltaic (PV) effect. Semiconductor materials, such as monocrystalline silicon, polycrystalline silicon, microcrystalline silicon, copper indium selenide, cadmium telluride, gallium arsenide, and others, are used commercially to produce PV cells that are combined into PV panels and modules. One way to boost photoelectric energy production is to use optics that concentrate the solar power onto a PV cell or module. These concentrator photovoltaic (CPV) modules are cost-competitive when used with high-efficiency multijunction GaAs-based PV cells. Energy conversion efficiency, which quantifies the portion of sunlight energy that is converted into electrical energy, varies from 10.2% for amorphous silicon-based PV cells at a concentration of 1 sun to 46.9% for multijunction PV cells at a concentration of 508 suns.

Solar energy can also be collected as thermal energy. Thermal receivers are devices that absorb solar radiation, converting it into heat and then transferring the heat to a fluid such as air, water, or oil. Solar receivers can be classified as non-concentrating or concentrating based on whether concentrating optics are used or not. A concentrating thermal receiver typically works with a parabolic mirror or Fresnel lens that focuses sunlight onto the thermal receiver, thereby achieving the high temperatures needed for industrial applications and electric power production.

To more efficiently use solar energy, hybrid concentrator photovoltaic-thermal (CPVT) power systems have been developed that combine CPV modules with thermal receivers to generate electrical energy and thermal energy simultaneously. Industrial process heat accounts for more than two-thirds of the total global industrial energy consumption, which is a large market for solar energy that is almost entirely untapped. Most of the demand is for temperatures below 250° C. CPVT power systems can reach these temperatures due to the separate configurability of CPV modules and thermal receivers. Applications include food, wine and beverages, textiles, machinery, solar heating, desalination, enhanced oil recovery, and wood pulp and paper processing.

Although III-V multijunction PV cells have demonstrated improved performance compared to single-junction PV cells, more than half of the absorbed solar energy is converted to thermal energy, causing the junction temperature to rise. Since the efficiency of a PV cell typically decreases as its temperature increases, cooling systems are frequently used to keep PV cell efficiency optimized. Many active cooling systems for CPV modules pump a heat transfer fluid or gas across a thermally conductive backplane upon which the PV cells are mounted. The waste heat is captured by the fluid (e.g., via thermal conduction from the backplane into the fluid) and carried away from the PV cells. This waste heat may be dumped, which reduces system efficiency. Alternatively, the waste heat can be utilized for low-temperature (e.g., less than 80° C.) process-heat applications.

The present embodiments feature systems and methods for direct fluid cooling of PV cells in which the PV cells are fully immersed in a flowing heat transfer fluid. Specifically, at least a portion of both the front face and the rear face of each PV cell comes into direct contact with the heat transfer fluid. In some embodiments, the entire front face of each PV cell and a center region of the rear face of each PV cell come into direct contact with the heat transfer fluid. Advantageously, the present embodiments extract waste heat more efficiently from the PV cells, as compared to the indirect cooling methods described above and direct cooling methods in which the heat transfer fluid only flows over one face of each PV cell. Part of the increased efficiency arises from the extra surface area with which the fluid contacts each PV cell, which allows for faster heat flow via thermal conduction out of the PV cells and into the fluid. The present embodiments also do not require any conductive backplane, which reduces component count and increases transmission of unabsorbed infrared light to a subsequent thermal receiver.

The present embodiments also feature a spectrum splitting CPV module that utilizes direct fluid cooling of PV cells. This CPV module may be combined with a thermal receiver to form a CPVT power system. For example, the CPV module may use III-V multijunction cells with a lowest bandgap energy around 1.4 eV. In this case, ultraviolet and visible light are directly absorbed and converted to electrical energy, while unabsorbed infrared light passes through the CPV module, after which it is captured by a thermal receiver as thermal energy. This spectrum-splitting approach is angle-insensitive and more efficient than other spectrum splitting approaches. The CPV module may be kept below 110° C., where PV cells optimally perform, while the thermal receiver may heat its own heat transfer fluid to a higher temperature (e.g., 250° C. or more).

BRIEF DESCRIPTION OF THE FIGURES

FIG. 11 is a table listing properties of four categories of commercially available heat transfer fluids: glycols, mineral oils, synthetic oils, and silicone oils.

FIG. 16 is a table of the predicted transmitted power, measured transmitted power, and power lost fractions for different tests of the prototype CPV module.

FIG. 20 is a table summarizing performance of the prototype CPV module.

DETAILED DESCRIPTION OF THE EMBODIMENTS

Figure 1:
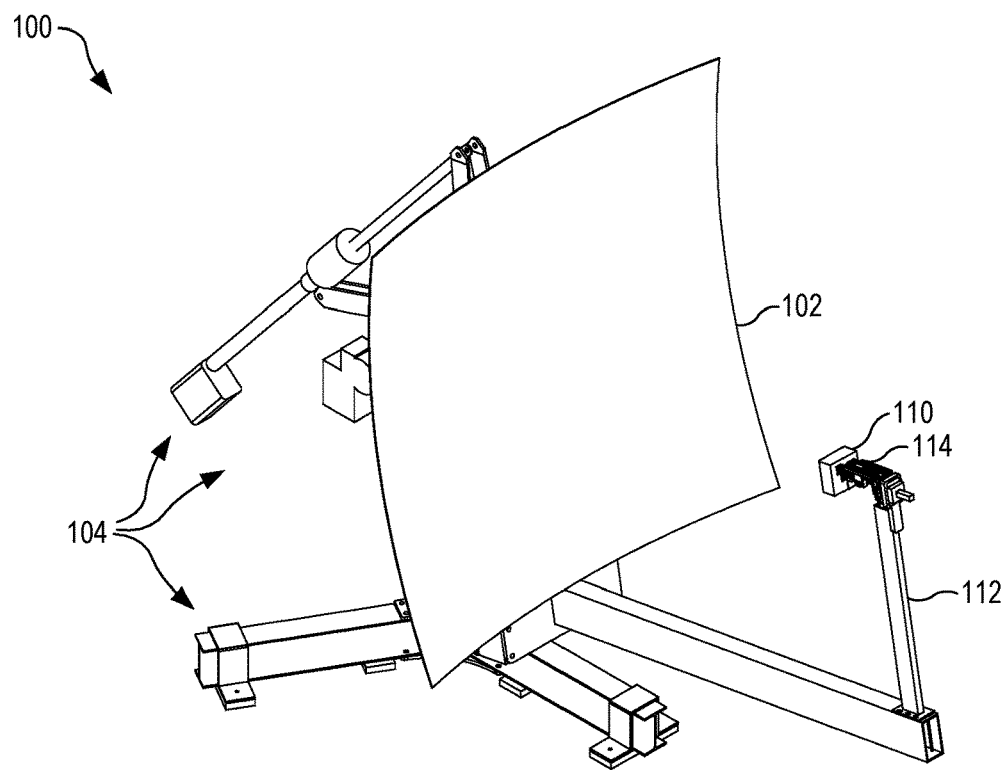
FIGS. 1 and 2 are a perspective view and side view, respectively, of a concentrator photovoltaic-thermal (CPVT) power system that uses a spectrum-splitting concentrator photovoltaic (CPV) module, in an embodiment.
Figure 2:
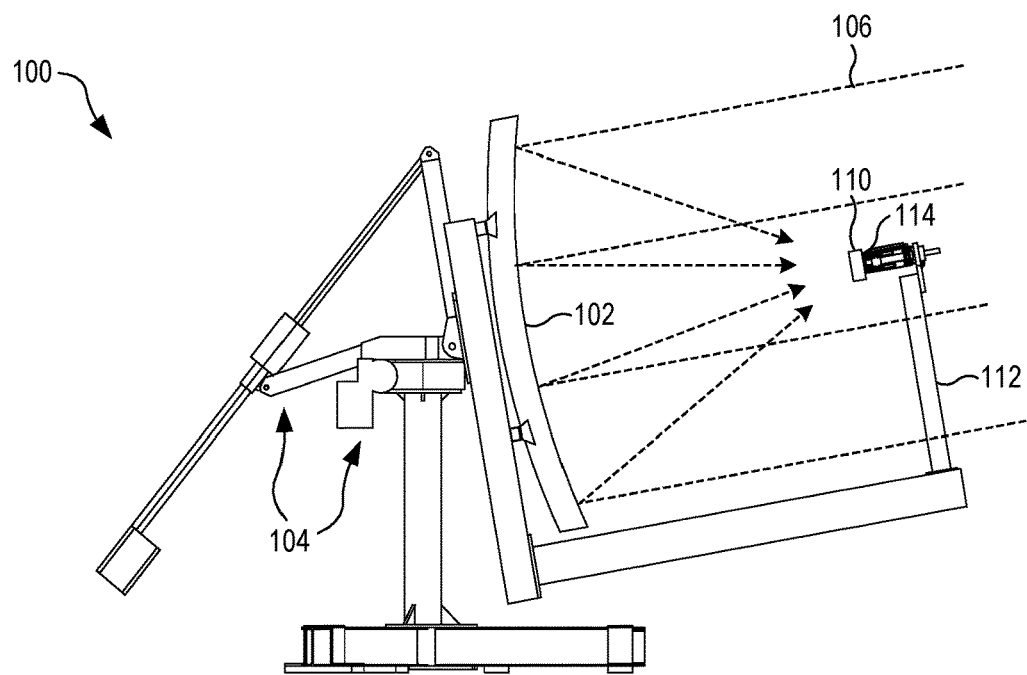

FIGS. 1 and 2 are a perspective view and side view, respectively, of a concentrator photovoltaic-thermal (CPVT) power system 100 that uses a spectrum-splitting concentrator photovoltaic (CPV) module 110 to convert sunlight 106 into electrical power. The CPVT power system 100 includes a concentrator dish 102 that reflects and concentrates sunlight 106 onto the CPV module 110, which is affixed to a support arm 112. Visible and ultraviolet components of the sunlight 106 are converted into electrical energy using photovoltaic (PV) cells in the CPV module 110 (e.g., see PV cells 406 in FIGS. 4, 5, 7, and 8). Infrared components of the sunlight 106 transmit through the CPV module 110 to a thermal receiver 114 that converts the infrared light into heat. The CPV module 110 and thermal receiver 114 are located near the focal point of the concentrator dish 102, and oriented to directly face the concentrator dish 102. As described in more detail below, embodiments of the CPV module 110 have been tested at low concentrations (i.e., less than 100 suns) and medium concentrations up to 166 suns. However, the present embodiments may be implemented at even higher sunlight concentrations (e.g., 500 suns or more, corresponding to high concentration PV) without departing from the scope hereof.

The CPVT power system 100 also includes a two-axis tracker 104 that changes an elevation angle, an azimuthal angle, or both, of the concentrator dish 102 as the sun moves across the sky. The CPV module 110, thermal receiver 114, and support arm 112 are affixed to the tracker 104 and also move with the concentrator dish 102 so that the CPV module 110 and thermal receiver 114 are always located near the focal point of the concentrator dish 102 and facing the concentrator dish 102. Tracking of the sun with the two-axis tracker 104 maximizes the amount of the sunlight 106 that the concentrator dish 102 focuses onto the CPV module 110, thereby maximizing the electrical power generated by the CPV module 110 and the thermal power generated by the thermal receiver 114. In some embodiments, the CPVT power generation system 100 excludes the thermal receiver 114, thereby generating only electrical power from the sunlight 106.

Figure 3:
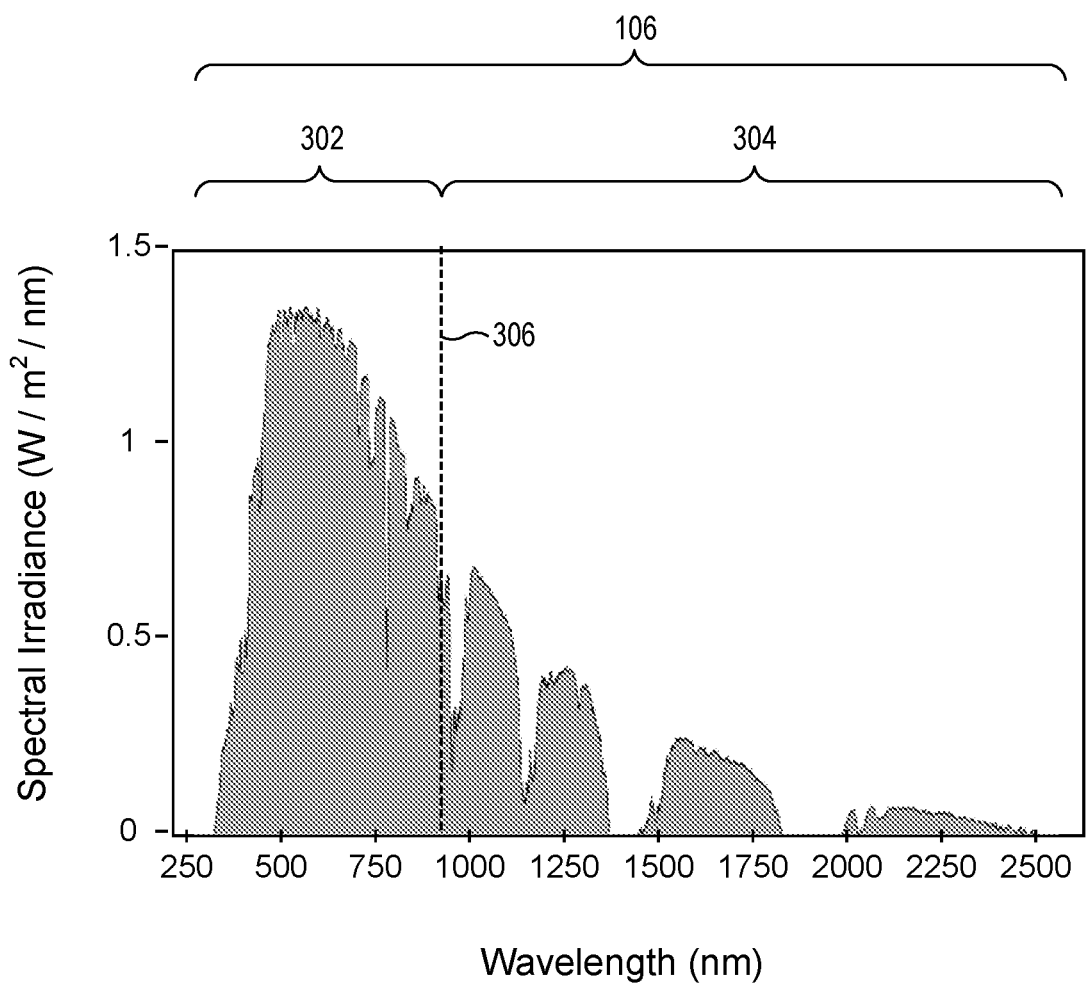
FIG. 3 is a plot of the AM1.5G solar spectrum showing visible/ultraviolet light and infrared light.

FIG. 3 is a plot of the AM1.5G solar spectrum showing visible/ultraviolet light 302 that is converted into electrical energy by the PV cells in the CPV module 110, and infrared light 304 that is transmitted through the CPV module 110. FIG. 3 represents the spectrum of the sunlight 106. In FIG. 3, the division between visible/ultraviolet light 302 and infrared light 304 occurs at a transition wavelength 306 near 900 nm. For example, each PV cell may be a III-V triple-junction PV cell with a $Al_{0.23}In_{0.51}Ga_{0.26}P$ subcell (bandgap energy of 2.10 eV), a $Al_{0.18}Ga_{0.82}As$ subcell (bandgap energy of 1.67 eV), and a GaAs subcell (bandgap energy of 1.42 eV), all on top of a lightly doped GaAs substrate. In this case, the transition wavelength 306 is approximately 873 nm. However, different materials and/or doping concentrations may be used for the subcells and substrate, resulting in a different transition wavelength 306 than shown in FIG. 3. Depending on the transition wavelength 306, the visible/ultraviolet light 302 may include some light in the infrared region of the electromagnetic spectrum. The present embodiments may be alternatively used with PV cells having more than three subcells (e.g., four or more), less than three subcells (e.g., one or two), or a combination thereof.

Figure 4:
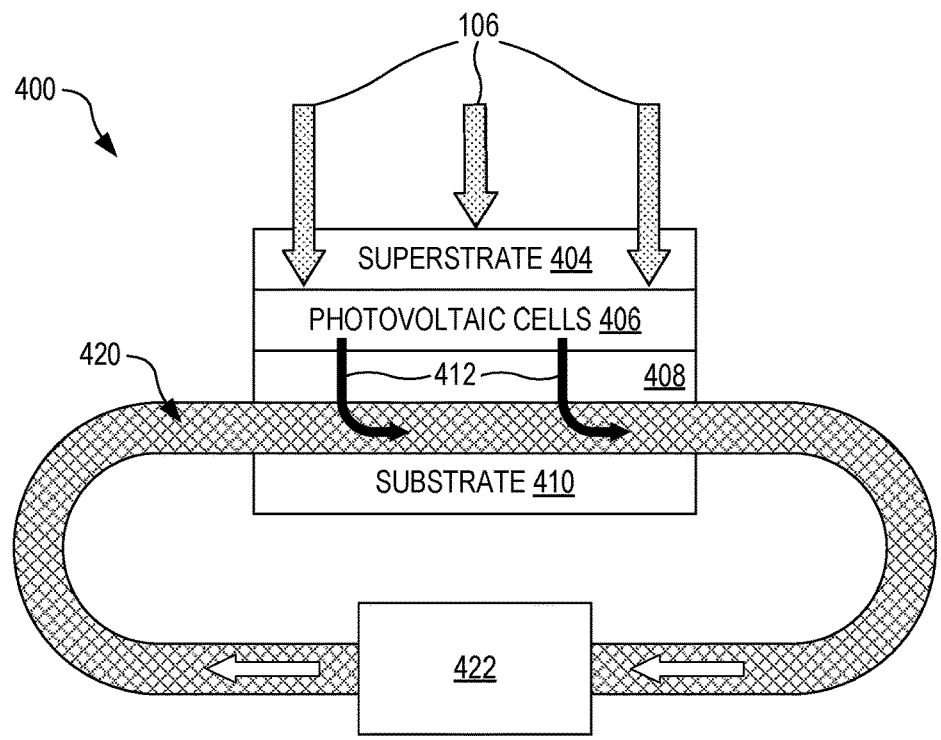
FIG. 4 illustrates indirect microfluidic cooling of photovoltaic (PV) cells in an optoelectronic stack.

FIG. 4 illustrates indirect microfluidic cooling of PV cells 406 in an optoelectronic stack 400. Sunlight 106 passing through a transparent superstrate 404 illuminates the PV cells 406, which convert some of the visible/ultraviolet light 302 into electrical power. Heat 412 generated by the PV cells 406 is conducted through a heat transfer plate 408 into a flowing heat transfer fluid 420. Infrared light 304 not absorbed the PV cells 406 may be transmitted through a transparent substrate 410 to a thermal receiver (e.g., the thermal receiver 114 of FIGS. 1 and 2). A heat exchanger 422 removes the heat 412 from the heat transfer fluid 420, and pumps the heat transfer fluid 420 so that it flows with a sufficient speed to cool the heat transfer plate 408, and therefore the PV cells 406. The cooling demonstrated in FIG. 4 is "indirect" in that the PV cells 406 are not in direct contact with the heat transfer fluid 420.

Figure 5:
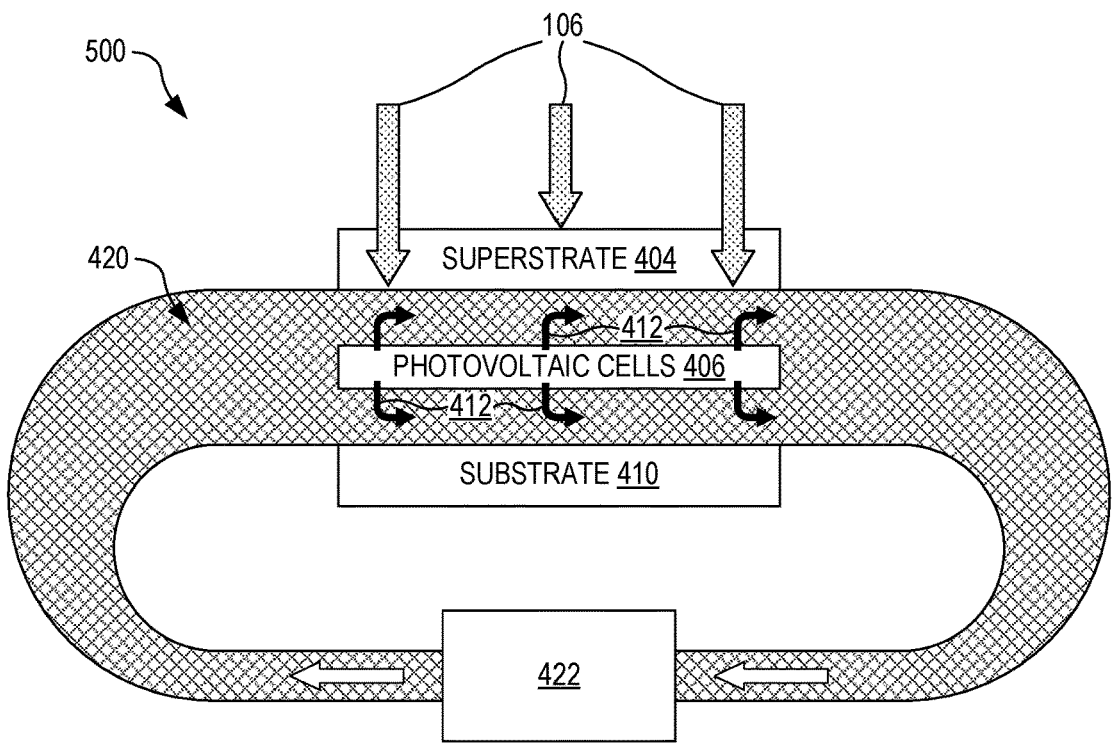
FIG. 5 illustrates how the present embodiments implement direct fluid cooling of the PV cells, in embodiments.

FIG. 5 illustrates how the present embodiments implement direct fluid cooling of the PV cells 406 in an optoelectronic stack 500, in embodiments. The optoelectronic stack 500 is similar to the optoelectronic stack 400 of FIG. 4, except that it excludes the heat transfer plate 408. Here, the term "direct" means that the heat transfer fluid 420 comes into direct physical contact with (a) at least a portion of the front face of each PV cell 406, and (b) at least a portion of the rear face of each PV cell 406. Here, the front face is the planar side of each PV cell 406 that receives the sunlight 106, while the rear face is the planar side of each PV cell 406 through which unabsorbed infrared light 304 exits the PV cell 406. In some embodiments, the heat transfer fluid 420 comes into direct contact with the entire front face of each PV cell 406 (including any bus bars and electrical fingers). In some embodiments, the heat transfer fluid 420 comes into direct contact with the entire active area of the front face of each PV cell 406. In some embodiments, the heat transfer fluid 420 comes into direct contact with the entire rear face of each PV cell 406 (including any bus bars and electrical fingers). In some embodiments, the heat transfer fluid 420 comes into direct contact with only a center region of the rear face of each PV cell 406.

By eliminating the heat transfer plate 408, the direct fluid cooling shown in FIG. 5 has many advantages over the indirect microfluidic cooling shown in FIG. 4. First, component count and cost are reduced. More specifically, the heat transfer plate 408 can be made of sapphire, which offers mechanical robustness, high thermal conductivity, and high transmissivity in the visible and infrared. However, sapphire is fragile and prone to breakage, and is relatively expensive compared to other components of the CPV module 110.

Second, the heat transfer plate 408 introduces optical losses due to internal absorption and reflections at it interfaces. Therefore, eliminating the heat transfer plate 408 improves transmission of infrared light 304 to the thermal receiver, advantageously increasing the heat energy generated by the thermal receiver. Removing the heat transfer plate 408 also eliminates the heating that arises from internal absorption of the infrared light 304 as it propagates through the heat transfer plate 408.

Third, removal of the heat transfer plate 408 improves thermal conductivity between the PV cells 406 and the heat transfer fluid 420, advantageously keeping the PV cells 406 cooler. More specifically, by extracting heat 412 from both faces of each PV cell 406, the heat transfer fluid 420 is thermally coupled to each PV cell 406 with twice the surface area as compared to the indirect microfluidic cooling of FIG. 4. Therefore, direct fluid cooling can conduct heat 412 away from the PV cells 406 at approximately twice the rate as indirect microfluidic cooling (for the same temperature differential between the PV cells 406 and the heat transfer fluid 420).

Figure 6:
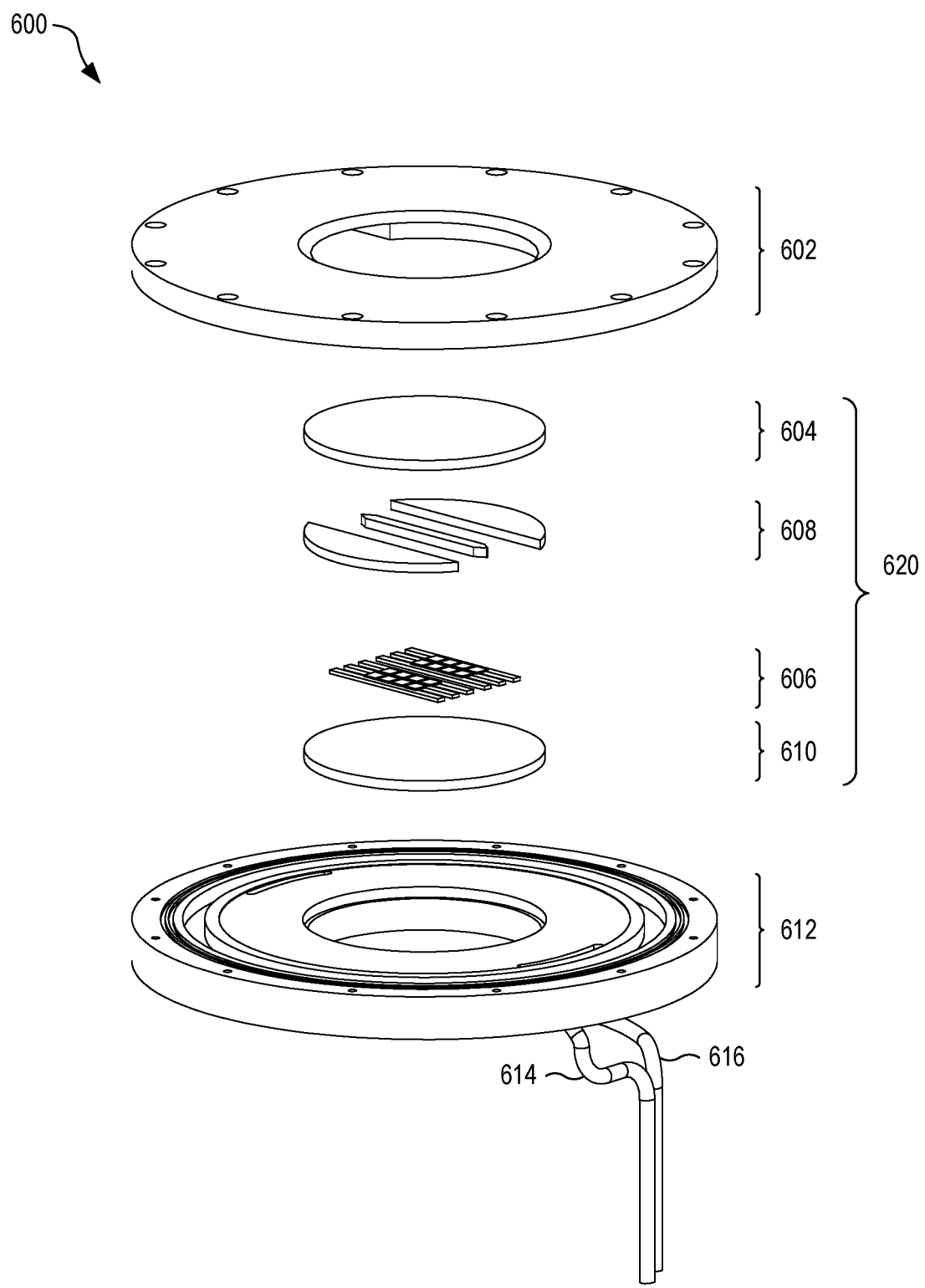
FIG. 6 is an exploded view of a spectrum-splitting CPV module that uses direct fluid cooling, in an embodiment.

FIG. 6 is an exploded view of a spectrum-splitting CPV module 600 that uses direct fluid cooling. The CPV module 600 may be used as the CPV module 110 in FIGS. 1 and 2. The CPV module 600 includes an upper annular collar 602 and a lower annular collar 612 that join together (e.g., via bolts) and cooperate with a planar transparent superstrate 604 and a planar transparent substrate 610 to form a sealed cavity. Here, "sealed" means that a heat transfer fluid (e.g., the heat transfer fluid 420 of FIGS. 4 and 5) can flow through the sealed cavity without leaking. Between the annular collars 602 and 612 is a stack 620 with (1) the planar transparent superstrate 604, (2) co-planar spacers 608 forming walls of one or more fluid channels through which the heat transfer fluid can flow, (3) one or more arrays 606 of PV cells 406 located within the one or more fluid channels, and (4) the planar transparent substrate 610. Sunlight 106 can enter the sealed cavity via the superstrate 604, and unabsorbed infrared light 304 can exit the sealed cavity via the substrate 610. The upper annular collar 602 may be sealed to an outer face of the superstrate 604 (e.g., via epoxy) to prevent heat transfer liquid from leaking. The lower annular collar 612 may be similarly sealed to an outer face of the substrate 610. One of tubes 614 and 616 supplies heat transfer fluid to the sealed cavity, and the other of tubes 614 and 616 provides a return path for the heated fluid to exit the sealed cavity.

Figure 7:
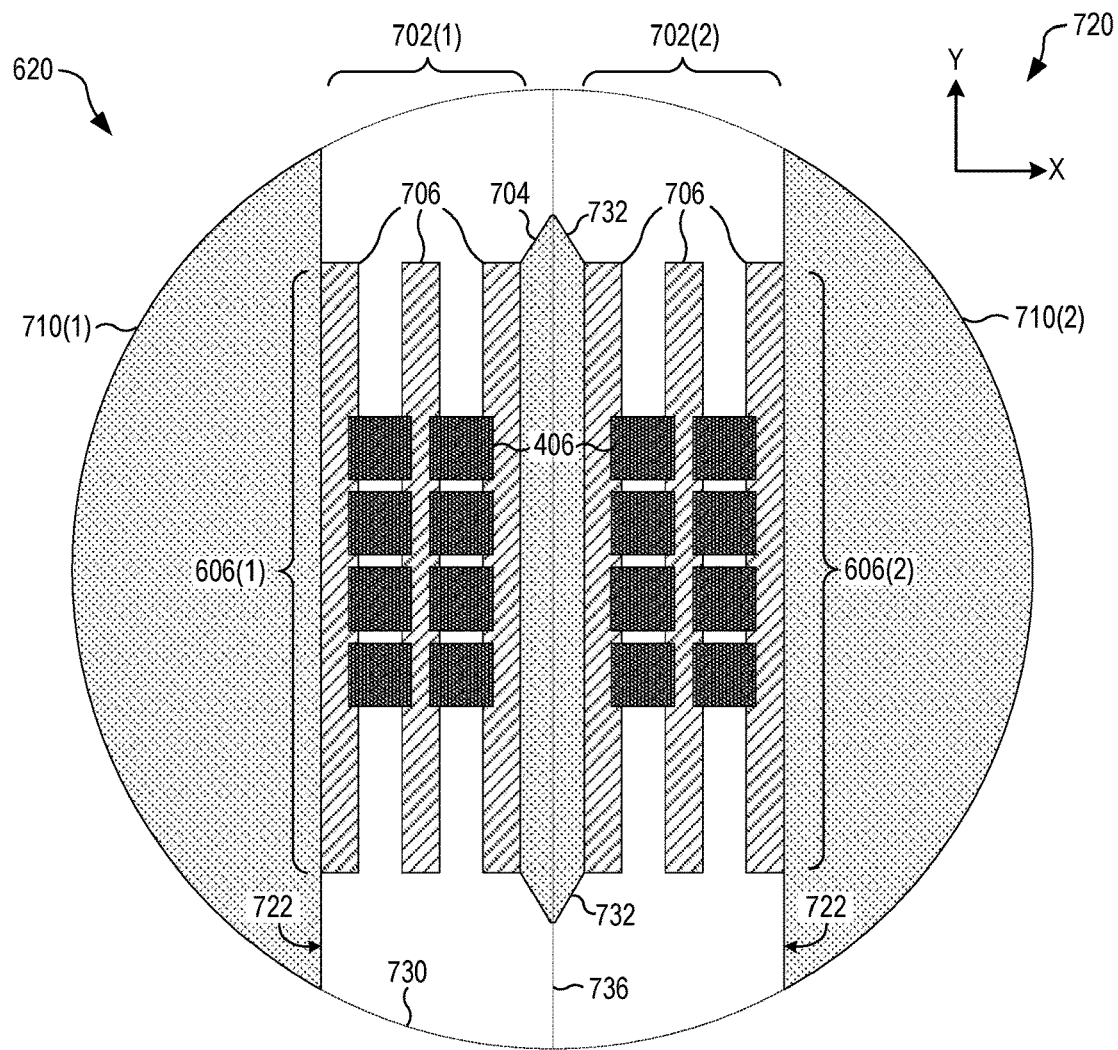
FIGS. 7 and 8 are a top view and side view, respectively, of a stack of the CPV module of FIG. 6, in an embodiment.
Figure 8:
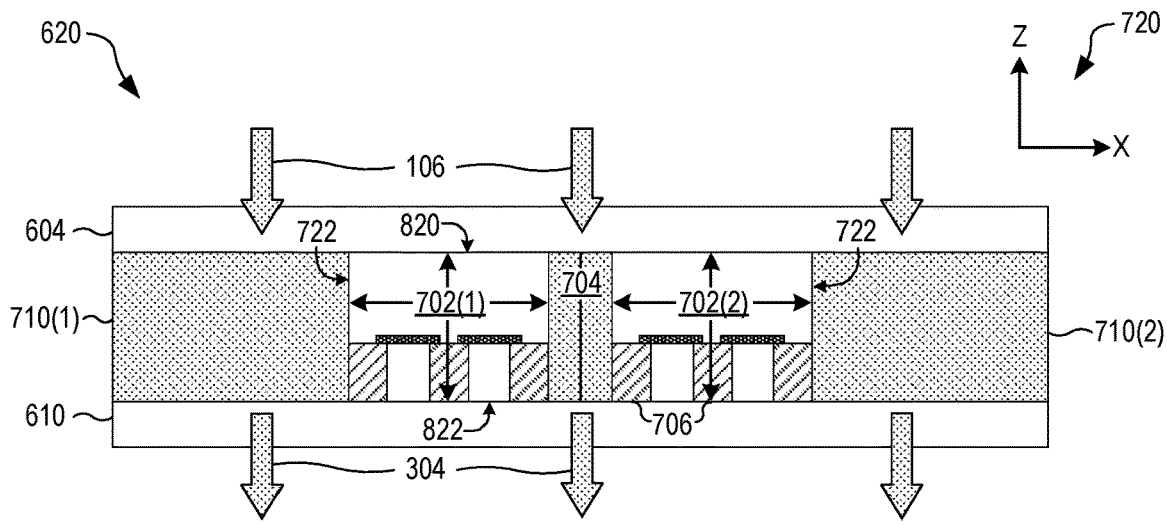

FIGS. 7 and 8 are a top view and side view, respectively, of the stack 620 of FIG. 6. For clarity, the planar transparent superstrate 604 and the planar transparent substrate 610 are only shown in FIG. 8. In the example of FIGS. 7 and 8, the co-planar spacers 608 of FIG. 6 are shown as a first "D"-shaped spacer 710(1) and a second "D"-shaped spacer 710(2). Each of the spacers 710(1) and 710(2) has a flat side that extends in the y direction (see right-handed coordinate system 720). These flat sides face each other to establish side walls 722 for one or more fluid channels 702. Curved sides of the spacers 710(1) and 710(2) define a circle 730 that is centered in the x-y plane with respect to the annular collars 602 and 610. The co-planar spacers 608 also includes a channel separator 704 that has a length in the y direction that is less than a diameter of the circle 730. In the x direction, the separator 704 is positioned halfway between the side walls 722 and centered along a centerline 736 of the circle 730, thereby establishing a first fluid channel 702(1) and a second fluid channel 702(2).

The "D"-shaped spacers 710 and the separator 704 have the same height in the z direction. Thus, the first "D"-shaped spacer 710(1), the second "D"-shaped spacer 710(2), and the separator 704 have co-planar top faces and co-planar bottom faces. Each of the co-planar top faces joins a bottom face of the planar transparent superstrate 604 to establish an upper wall 820 for the first and second fluid channels 702(1) and 702(2). Similarly, each of the co-planar bottom faces joins a top face of the planar transparent substrate 610 to establish a lower wall 822 for the first and second fluid channels 702(1) and 702(2).

Heat transfer fluid flows through the first and second fluid channels 702(1) and 702(2) in the y direction. The separator 704 has triangular-shaped ends 732 that divides the incoming heat transfer fluid into a first stream for the first fluid channel 702(1) and a second stream for the second fluid channel 702(2). The shape of the ends 732 is chosen to minimize turbulence when creating and recombining the first and second streams. The ends 732 may have another shape than shown in FIG. 7 to facilitate the creation and recombination of streams.

Placed within the first fluid channel 702(1) is a first array 606(1) of PV cells 406, and placed within the second fluid channel 702(2) is a second array 606(2) of PV cells 406. Each PV cell 406 is planar, lying flat in the x-y plane with a front face pointing upward in the +z direction to receive sunlight 106, and a rear face pointing downward in the −z direction. Each PV cell 406 is affixed to two of a plurality of supports 706 that extend lengthwise in the y direction (i.e., parallel to the flow direction of the heat transfer fluid). More specifically, the back face of each PV cell 406 is affixed to two of the supports 706 near two opposite edges (in the x direction) of the PV cell 406. This way of mounting the PV cells 406 to the supports 706 leaves most of the rear face of each PV cell 406 unsupported, advantageously allowing heat transfer fluid to directly contact most of the rear face. In the example of FIGS. 7 and 8, where each PV cell 406 is supported near two of its opposite edges, a center region of the rear face is unsupported and therefore can be directly fluid cooled (i.e., the heat transfer fluid can directly contact the center of the rear face).

In other embodiments, each PV cell 406 is supported by only one of the supports 706. For example, each support 706 may be affixed to only one row of PV cells 406, either near one edge (in the x direction) of each PV cell 406 in the one row, or near a row centerline passing through the center of each PV cell 406 in the one row. In this latter case, the support 706 may be affixed near the center region of the rear face of each PV cell 406, in which case heat transfer fluid may not directly contact the center region of the rear face. Instead, the heat transfer fluid may directly contact one or both regions of the rear face that are located on opposite sides of the row centerline.

With the supports 706 directly contacting only the rear faces of the PV cells 406, the supports 706 do not block transmission of incoming sunlight 106 into the front faces of the PV cells 406. However, the supports 706 may be of a material transparent to sunlight 106, in which case the supports 706 may be alternatively or additionally placed in direct contact with at least a portion of the front face of each PV cell 406.

Each support 706 has a height in the z direction such that each PV cell 406 is located entirely within one of the fluid channels 702. More specifically, the front face of each PV cell 406 is located below the bottom face of the superstrate 604, and the rear face of each PV cell 406 is located above the top face of the substrate 610. In the example of FIGS. 7 and 8, each PV cell 406 is positioned approximately halfway between the upper wall 820 and the lower wall 822. However, each PV cell 406 may be alternatively positioned closer to either the upper wall 820 or the lower wall 822, provided that heat transfer fluid can flow across both faces of all the PV cells 406.

In some embodiments, wires electrically connecting the PV cells 406 (e.g., in series) may be rigid enough to physically support each of the arrays 606 without any of the supports 706. By eliminating the supports 706, these embodiments advantageously reduce cost, improve reliability, and simplify construction. The wires may be connected to each PV cell 406 using solder or electrically conductive adhesive. In these embodiments, the wires connect to both the front face and back face of each PV cell 406, and not necessarily near the cell edges. With these connections, the heat transfer fluid can directly flow across most of the front face and most of the back face of each PV cell 406.

In the example of FIGS. 7 and 8, each of the arrays 606 has eight PV cells 406 arranged in two rows of four PV cells 406, where each row is defined by a different x position. Thus, each of the arrays 606 has three supports 760. However, each of the arrays 606 may have more or fewer PV cells 406, or a different arrangement (i.e., number of rows, or number of PV cells 406 within each row) than shown. For example, each of the arrays 606 may have n+1 supports 706 for n rows, where n is an integer greater than or equal to 1.

In some embodiments, the separator 704 is excluded so that the stack 620 forms only a single fluid channel 702. In other embodiments, one than one separator 704 is used to create more than two fluid channels 702. While FIGS. 7 and 8 show the fluid channels 702(1) and 702(2) as lying straight in the y direction, the fluid channels 702(1) and 702(2) may be curved, or have another shape, provided that heat transfer fluid can flow over both faces of all the PV cells 406.

FIGS. 7 and 8 show the first and second arrays 606(1) and 606(2) mirroring each other about the centerline 736. Thus, the first and second arrays 606(1) and 606(2) together form a two-dimensional array that is symmetric about the centerline 736. In this case, no PV cell 406 lies on the centerline 736, and the total number of rows in both of the first and second arrays 606(1), 606(2) is an even number. Positioning all of the PV cells 406 away from the centerline 736 may improve efficiency when the support arm 112 also extends along the y direction and is centered on the stack 620 in the x direction (e.g., as shown in FIG. 1). In this case, the support arm 112 creates a shadow that coincides with half of the centerline 736 (assuming the stack 620 is centered at the focal point of the concentrator dish 102, as shown in FIG. 1). PV cells 406 lying within the shadow generate less electrical power than PV cells 406 that are not in the shadow. The different currents generated by these different PV cells 406 make it more difficult to connect these PV cells 406 in series, and may result in more complex wiring inside of the stack 620. In other embodiments, the stack 620 includes one or more PV cells 406 along the centerline 736 instead of the separator 704. These center-aligned PV cells 406 may be wired to the first array 606(1), the second array 606(2), or form a third array.

The superstrate 604 and substrate 610 may be fabricated from a material with high mechanical strength and thermal stability, minimal absorption over the solar spectrum (see FIG. 3), and resistance to large thermal shock. For example, the material may be fused silica quartz, such as Tosoh N Series silica glass. However, each of the superstrate 604 and substrate 610 may be fabricated from another material. In particular, the superstrate 604 and substrate 610 may be fabricated from different materials. For example, the substrate 610 may be made from a material that only transmits infrared light 304 with minimal loss, while the superstrate 604 is a made from a material that transmits both infrared light 304 and visible/ultraviolet light 302. To increase transmission, one or both of the superstrate 604 and substrate 610 may be anti-reflection coated, either on the inner face, the outer face, or both. The superstrate 604 may be affixed to the upper annular collar 602 using an optical adhesive (e.g., Norland Products NOA 86H) to hermetically seal the joint where the superstrate 604 meets the upper annular collar 602. The substrate 610 may be similarly affixed to the lower annular collar 612.

In some embodiments, the co-planar spacers 608 (e.g., the "D"-shaped spacers 710(1) and 710(2), and the separator 704) are fabricated from a silicone elastomer, such as Dow Corning Sylgard 184. Silicone elastomers are frequently used as an encapsulant for PV components and systems due to their high transmissivity to the solar spectrum, wide range of operating temperatures, and low cost. In these embodiments, the co-planar spacers 608 can be fabricated by: (1) placing a "stamp" on the top face of the substrate 610 where the one or more fluid channels 702 are to be located, (2) preparing uncured silicone elastomer in a liquid or gel-like state, (3) pouring the uncured silicone elastomer on top of the substrate 610 to that it covers the substrate 610 and flows around the stamp, (4) curing the silicone elastomer, and (5)

removing the stamp and excess cured elastomer. The arrays 606(1) and 606(2) may then be placed into the fluid channels 702, after which the superstrate 604 may be placed on top of the co-planar spacers 608. Finally, the upper annular collar 602 may be placed over the superstrate 604 and affixed to the lower annular collar 612 to seal the stack 620. One advantage of this technique is that the co-planar spacers 608 adhere to the substrate 610 while curing, fixing their position without forming any air gaps with the substrate 610, which can reduce transmission due to Fresnel reflections. The cured silicone elastomer may have a refractive index close to that of the superstrate 604 and substrate 610, also avoiding losses due to Fresnel reflections.

In other embodiments, the co-planar spacers 608 are fabricated from another material exhibiting high transmissivity in the solar spectrum, good thermal stability, and resistance to thermal shock. For example, the co-planar spacers 608 may be fabricated from pieces of fused silica or glass. In these embodiments, the co-planar spacers 608 may be machined or ground from optically polished wafers. The use of optically polished wafers in these embodiments increases transmission by reducing scattering of light on the top and bottom faces of the co-planar spacers 608. Optically polished top and bottom faces also allow the co-planar spacers 608 to be contact bonded to the substrate 610 and/or the superstrate 604, again minimizing air gaps that can reduce transmission due to Fresnel reflections. A thin layer of silicone elastomer encapsulant or optical adhesive may be alternatively used to affix the co-planar spacers 608 to the substrate 610 and superstrate 604.

To further increase transmission of unabsorbed infrared light 304 out of the stack 620, the supports 706 may also be fabricated from a material with high mechanical and thermal stability, minimal absorption, and resistance to large thermal shock. For example, the supports 706 may be fabricated out of quartz. In this case, each photovoltaic cell 406 may be affixed to supports 706 using optical adhesive. Bottoms faces of the supports 706 may also be affixed to the substrate 610 using optical adhesive.

Figure 10:
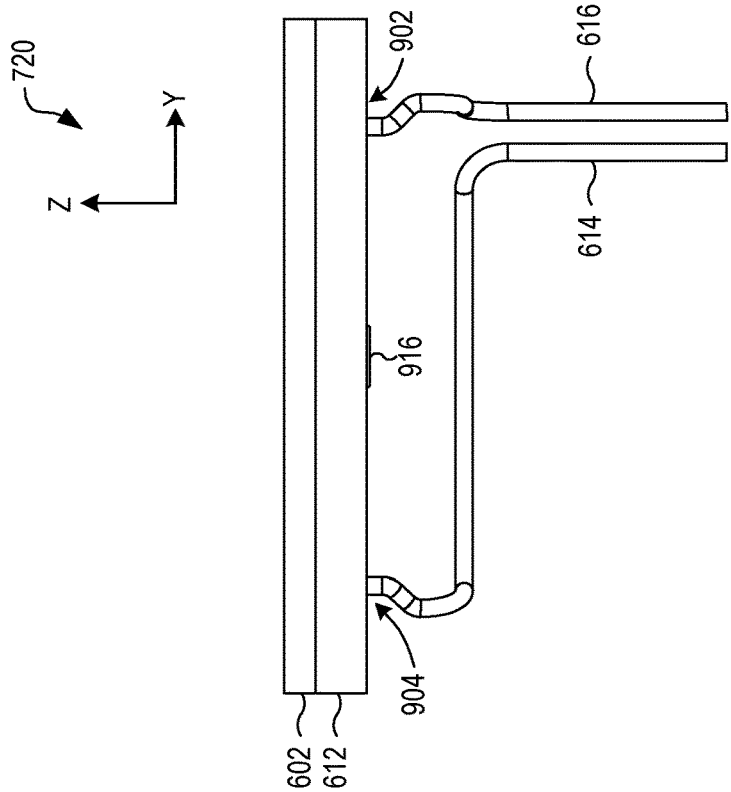
FIGS. 9 and 10 are a top cut-away view and a side view, respectively, of the CPV module of FIG. 6, in an embodiment.
Figure 9:
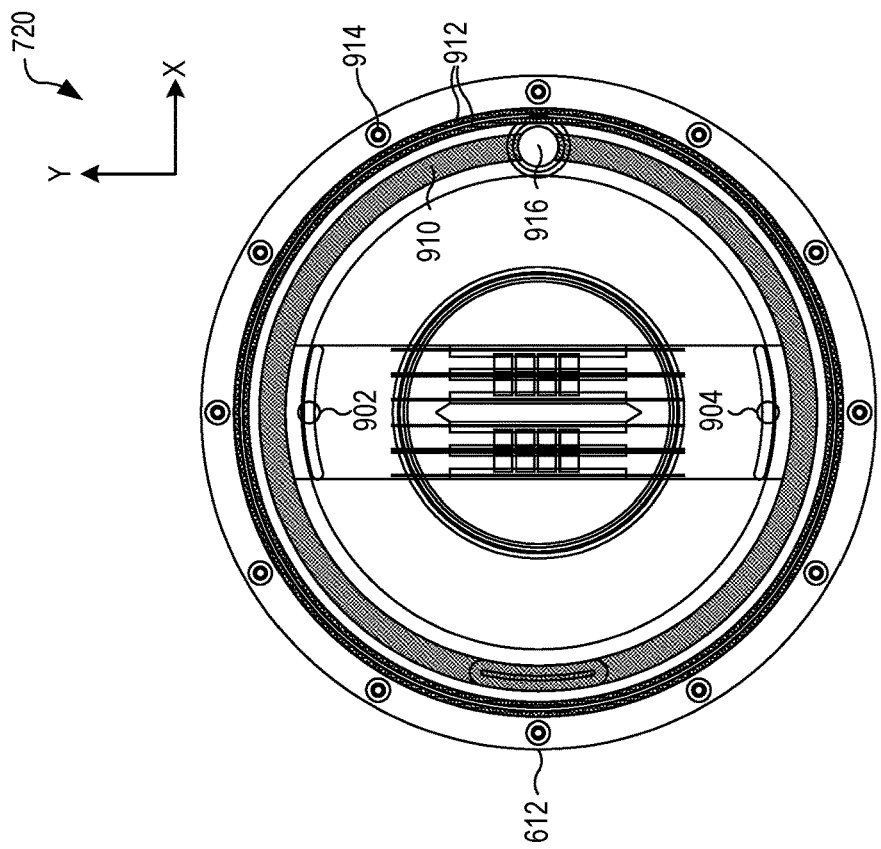

FIGS. 9 and 10 are a top cut-away view and a side view, respectively, of the CPV module 600 of FIG. 6. The lower annular collar 612 forms a first port 902 and a second port 904 through which heat transfer fluid enters and exits the CPV module 600. Due to the symmetry, either one of the ports 902 and 904 may serve as an inlet, wherein the other of the ports 902 and 904 serves as an outlet. The lower annular collar 612 also forms a wire groove 910 within which internal wires can be secured while minimizing the amount of light they block. These wires connect the PV cells 406 to a hermetic electrical connector 916. The lower annular collar 612 also forms one or more O-ring grooves 912 within which corresponding one or more O-rings may be seated. The lower annular collar 612 also forms a plurality of bolt holes 914, either tapped holes or through-holes, that match a corresponding plurality of bolt holes in the upper annular collar 602. Bolts passing through the bolt holes 914 may be used to seal the annular collars 602 and 612 together, as shown in FIG. 10.

While FIGS. 6-10 show the CPV module 600 shaped as a cylinder (with a cylindrical axis parallel to the z direction and a circular shape in the x-y plane), the CPV module 600 may be alternatively shaped as a right polygonal prism, such as a right hexagonal prism, a right rectangular prism, a right square prism, a right octagonal prism, etc. The use of a polygonal-shaped cross section, as opposed to circular, may advantageously improve efficiency and light collection, depending on the shape of the concentrator dish 102, and the layout of the arrays 606 of photovoltaic cells 406.

The heat transfer fluid is ideally optically transparent across the solar spectrum and electrically insulating to isolate the PV cells 406 from each other and prevent shunt currents. Furthermore, the heat transfer fluid is ideally low-cost, has an appropriate operating temperature range, is chemically inert (i.e., does not degrade the cells), can withstanding large solar fluxes without degradation, and is environmentally friendly. To avoid losses due to Fresnel reflections, the heat transfer fluid ideally has a refractive index close to those of the superstrate 604 and substrate 610 (e.g., 1.458 at 600 nm for fused silica). The heat transfer fluid ideally has good thermal properties, including a high thermal conductivity and a large specific heat capacity.

FIG. 11 is a table listing properties of four categories of commercially available heat transfer fluids: glycols, mineral oils, synthetic oils, and silicone oils. Silicone oils are good candidates for use with the present embodiments due to their high transmittance over the solar spectrum. The inventors have demonstrated that PV cells 406 immersed in silicone oil for two months did not notably degrade their electrical performance. By contrast, the inventors have also shown that a chemical reaction between III-V multijunction cells and glycols corrodes the surfaces of the PV cells 406, deteriorating their electrical performance after immersion for several days. Water is known to electrically short and degrade the PV cells 406, and therefore is not an optimal choice for the heat transfer fluid. In some embodiments, the heat transfer fluid is Xiameter PMX-100, a silicone oil with a thermal conductivity of 0.155 W/m·K, a heat capacity at constant pressure of 1500 J/kg·K, and a dynamic viscosity of $4.88 \times 10^{-2}$ Pa·s. However, the heat transfer fluid may be another type of polydimethylsiloxane (PDMS) silicone oil without departing from the scope hereof. In some embodiments, the heat transfer fluid has a viscosity less than or equal to 100 cP.

Design and Modeling Methodology

A prototype of the CPV module 600 was constructed and tested. As shown in FIG. 6, the prototype CPV module 600 contains three subsystems: an opto-electronic stack, a heat-transfer-fluid (HTF) cooling system, and a protective housing. The opto-electronic stack is composed of the PV cells 406, six quartz supports 706 that hold the PV cells 406 in place while allowing fluid to flow on both sides, copper electrodes that connect the front and back busbars of the PV cells 406 to neighboring PV cells 406, and electrical wires that connect each row of PV cells 406. The optical aperture diameter of the prototype CPV module 600 is 76.2 mm. Sixteen PV cells 406 were adhered to the six quartz supports 706 in a 4×4 array, which can be changed to adjust the fraction of transmitted light through the CPV module 600 for thermal collection versus electrical collection, as needed according to user requirements.

The HTF cooling system contains a polydimethylsiloxane (PDMS) cooling channel (e.g., co-planar spacers 608), thermocouples, the HTF, and the inlet and outlet ports. Patterned PDMS cooling channels were attached to the substrate, and the HTF is guided along the cooling channels to maximize fluid flow directly across the PV cells 406. The PV cells 406 and quartz supports 706 are positioned within the channels, causing the HTF to run parallel to the supports 706 and both over and under the PV cells 406. Therefore, the waste heat from the PV cells 406 is removed by the HTF from both the top and bottom faces of each PV cell 406.

The housing system has two aluminum collars (i.e., upper annular collar 602 and lower annular collar 612) and two pieces of fused silica glass as superstrate and substrate (i.e., superstrate 604 and substrate 610), which makes the optoelectronic subsystem electrically insulated and the HTF cooling sub-system leakproof.

Optical Modeling—A transfer matrix-style method was used to calculate the transmission through the prototype CPV module 600. In this model, all interfaces were assumed to be planar, where the reflection and transmission at each interface was obtained using Fresnel's equations. The internal transmittance of each layer can be described by the absorption coefficient of the material and the light path of the beam through the corresponding layer. Starting from a simple triple-layer structure, the overall transmittance was calculated by summing all light exiting the second layer with multiple reflections between the first and the second interfaces considered. When one more layer is added underneath, the triple-layer structure can be treated as a single layer. The new total transmittance can be calculated as above. Shadowing effects from the copper wires are included as well as reflectance at the interfaces of the front and back sides of the PV cells 406.

Electrical Modeling—

Under concentrated flux irradiation, PV cells 406 in the prototype CPV module 600 are assumed to have short-circuit currents that increase linearly, and open-circuit voltages that increase logarithmically, with the current. With these numbers known, the electrical output of the CPV module 600 can be predicted based on the physical circuit orientation and Kirchhoff's laws. The prototype CPV module 600 was wired with four quadrants of four PV cells 406. In this configuration, PV cells 406 within each quadrant are connected in parallel while the four quadrants are wired in series. This results in a four-fold increase in voltage, delivering an expected $V_{on}$ of 14.0 V, which eliminates the need for external DC/DC converters. However, this configuration limits the overall power because of the current mismatch among these four quadrants. Thus, the electrical model incorporates current mismatch losses as well as series resistance losses.

The PV cells 406 used in the prototype CPV module 600 have three junctions (2.098 eV/1.675 eV/1.410 eV) on a GaAs substrate with dimensions 5.5×5.5 mm (fabricated by Boeing-Spectrolab). They have sparse contact grids on the front and back surfaces with a center-aligned busbar. The PV cells 406 were designed to maximize transmission of infrared light 304 with wavelengths greater than 873 nm. These PV cells 406 have an average in-band efficiency at 1-sun of 31.0% at one sun, with a full spectrum efficiency of 19.2% measured in the lab. For concentrated testing and modeling, the standard intensity of 900 W/m$^2$ at 1 sun for the AM1.5 spectrum was used. The electrical model predicted 28.3% in-band and 17.5% full spectrum conversion efficiency for light incident on the PV cells 406 under concentration of 166 suns.

Thermal Modeling—To investigate the cooling performance of the direct contact cooling, finite element method modeling COMSOL with used to simulate the temperature profile of the prototype CPV module 600. Only one column of PV cells 406 was modeled, with boundary conditions reflecting the module symmetry used to take the full scale of the CPV module 600 into account, which increases the computational efficiency. In the model, the HTF cooling channel had a 3-mm thickness, the gap between neighboring PV cells 406 was 1 mm, and two 40-mm long quartz supports 706 were placed in parallel with a gap of 3.5 mm, supporting the PV cells 406 (5.5 mm wide) with 1 mm of overlap on each end while allowing the HTF to flow beneath. The silicone oil Xiameter PMX-100 was chosen as the HTF. The inlet temperature and the flow rate of the HTF were obtained from the outdoor tests. The energy absorbed by the HTF and the waste heat generated from the PV cells 406 were both included in the COMSOL simulation.

Lab Characterization and Analysis

First, the PDMS cooling channels (e.g., co-planar spacers 608) and six quartz supports 706 were attached to the substrate quartz window (e.g., substrate 610). Next, sixteen PV cells 406 were wired into eight cell pairs using 26 AWG copper wires attached to the front and back busbars of each pair via soldering. These eight pairs were attached in a 4×4 cell array (e.g., array 606) on the quartz supports 706 using an optical adhesive. After integrating the substrate quartz glass with the bottom aluminum collar (e.g., the lower annular collar 612) using an optical adhesive, the PV cells 406 were wired together.

Figure 12:
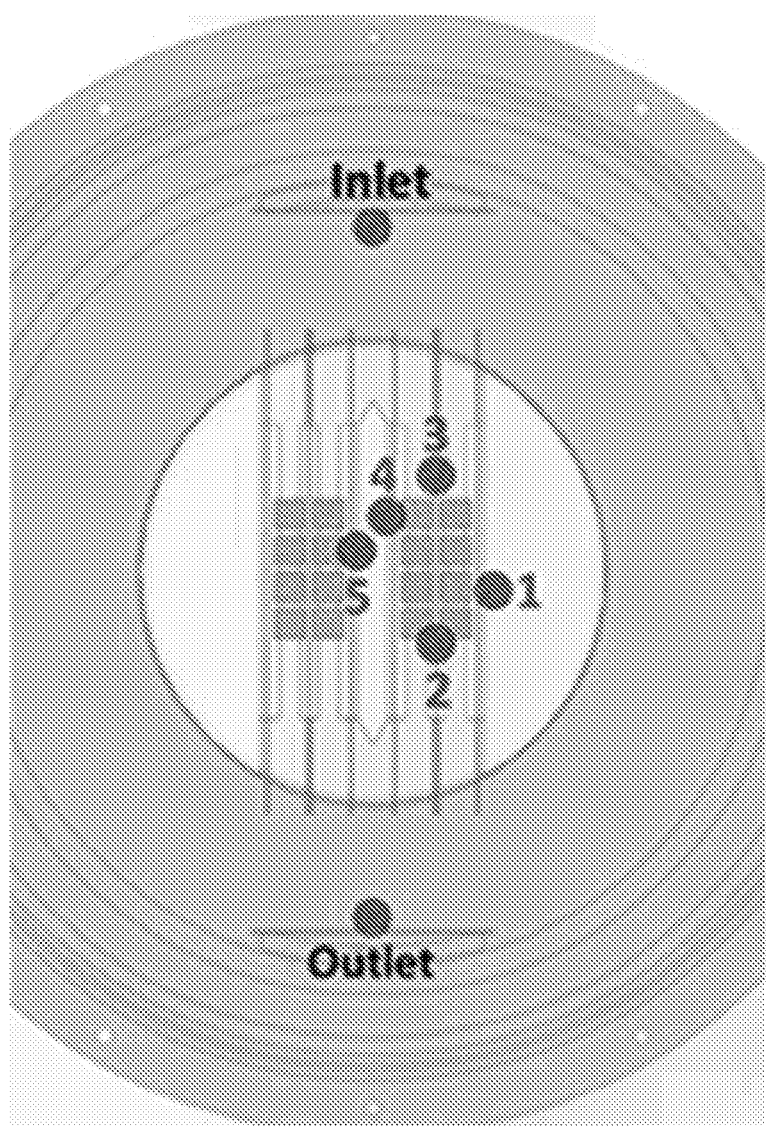
FIG. 12 shows the locations of seven thermocouples used to monitor temperatures of a prototype of the CPV module of FIGS. 6-10.

FIG. 12 shows the location of seven thermocouples used to monitor temperatures of the prototype CPV module 600. Five thermocouples were placed between the PV cells 406 for monitoring their temperatures during operation (labeled 1 to 5 in FIG. 12), while two more thermocouples were arranged at the fluid inlet and outlet ports for monitoring temperature changes of the heat transfer fluid (HTF) across the prototype CPV module 600. The prototype CPV module 600 was then closed by mounting the top collar (e.g., the upper annular collar 602) to the bottom collar using twelve screws. The prototype CPV module 600 also included HTF inlet/outlet ports, two-terminal electrical power output, and thermocouple outputs integrated into the bottom collar and designed for robust outdoor operation. Optical, electrical, and fluid flow characterization of the prototype CPV module 600 was performed prior to outdoor tests.

Optical Characterization: The prototype CPV module 600 can be divided into three regions: (a) cell regions where PV cells 406 are located, (b) surrounding bypass regions containing only 3-mm-thick PDMS silicone elastomer, and (c) regions where silicone oil HTF is sandwiched between the superstrate and substrate quartz windows. The transmission of the cell regions and the bypass regions is both modeled and characterized for light that is normally incident. Experimental characterization is performed using a broadband (185-1700 nm) spectrometer (Ocean Optics).

Figure 13:
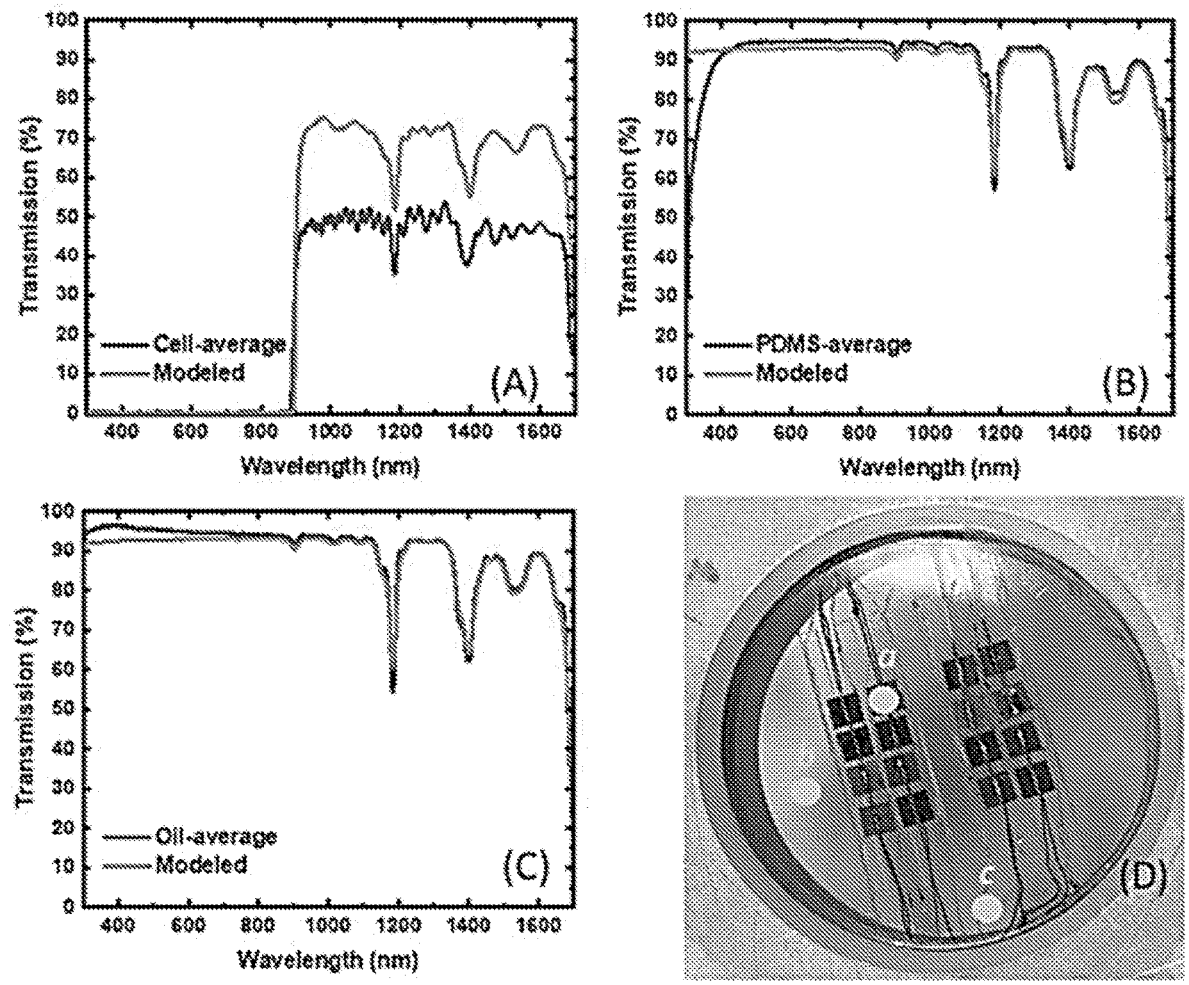
FIG. 13 shows exemplary plots of the measured and modeled transmission spectra through each of three regions of the prototype CPV module.

FIG. 13 shows exemplary plots of the measured and modeled transmission spectra through each of the three regions of the prototype CPV module 600. FIG. 13D shows example locations of each of these three regions. The numerical calculation of the out-of-band light transmittance of the cell regions is 63.0%, which is higher than the measured transmittance (from 35.9% to 55.6% with an average of 44.2%). This discrepancy is mainly due to interface scattering on both sides of the PV cells 406, which may be improved in future PV-cell fabrication runs. Since the HTF and PDMS silicone elastomer share similar optical properties, the measured transmittance for the bypass regions with the PDMS silicone elastomer and the HTF are close: 91.8% and 92.2% averaged over 6 and 10 measurements, respectively. The measured results are within the measurement error of the modeled result of 91.5%.

Figure 14:
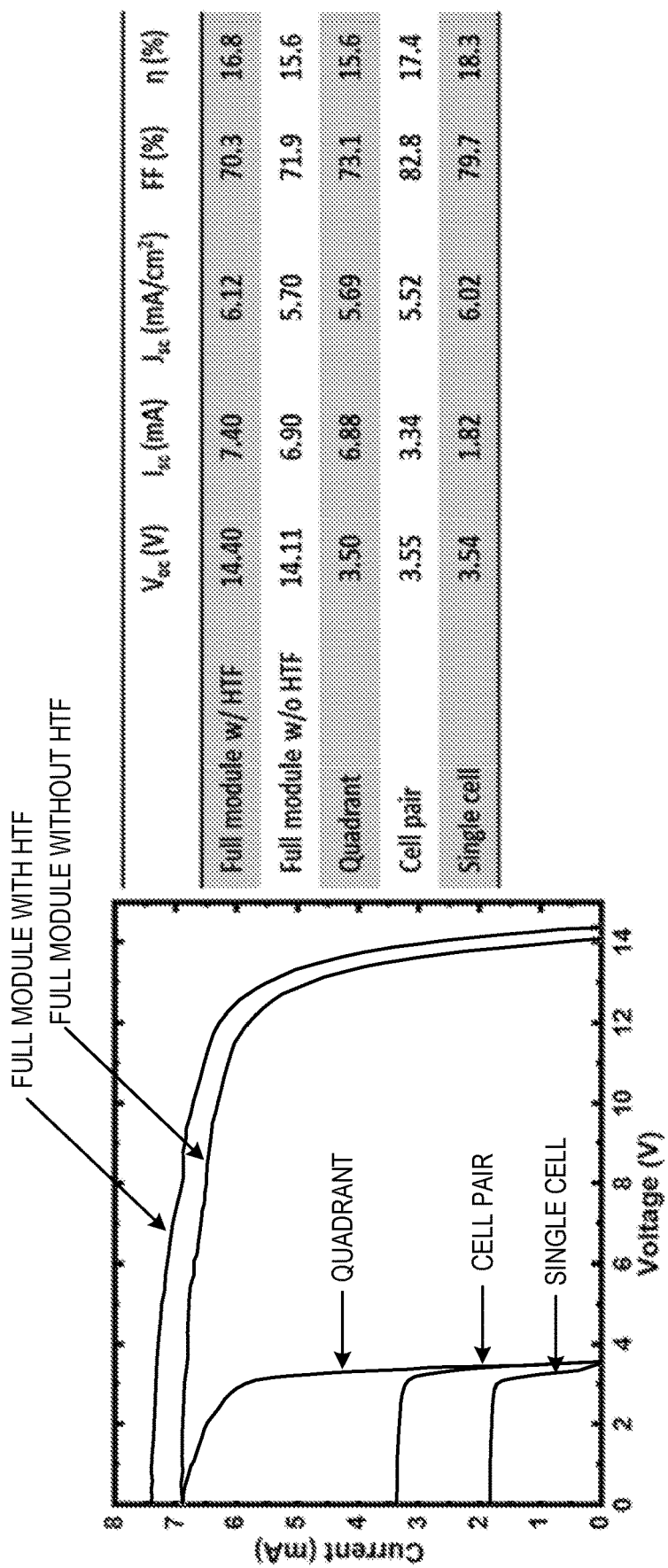
FIG. 14 shows exemplary current-voltage characteristic curves at different stages of construction of the prototype CPV module.

Electrical Characterization: FIG. 14 shows exemplary current-voltage characteristic curves measured with the PV cells 406 at different stages of construction of the prototype CPV module 600. The data in FIG. 14 was obtained by performing current-voltage (I-V) sweeps under a one-sun solar simulator (AM1.5D spectrum, TS Space). The table in FIG. 14 lists the typical electrical specifications for a single PV cell 406, a PV-cell pair, a quadrant, the full CPV module 600 without HTF, and the full CPV module with HTF. The $V_{oc}$ of the full CPV module 600 without HTF is almost four times that of a single PV cell 406, as expected. However, the $I_{sc}$ of the full CPV module 600 without HTF is a somewhat smaller than the expected four times that of a single PV cell 406, due to the shadowing caused by the copper wires on top of the PV cells 406. Comparing with the electrical performance of a single PV cell 406, the efficiency of the full CPV module 600 without HTF is 15.6%, with a lower fill factor (FF) of 71.9%, which is likely caused by current mismatches between the different quadrants and resistive losses on the copper wires. Interestingly, the CPV module 600 shows a higher $V_{oc}$, $I_{sc}$, and efficiency when testing with HTF than without HTF. This is also expected, as the flowing HTF reduces refractive-index mismatch between the superstrate glass and air inside the CPV module 600, thus reducing Fresnel reflection losses.

Outdoor Testing and Analysis

The prototype CPV module 600 was field-tested outdoors using a two-axis tracked 2.72 m² concentrating dish collector (45° rim angle, 1.5 m focal length). The parabolic mirror (e.g., see the concentrator dish 102 of FIG. 1) was selectively masked to reduce the incident concentration, which is adjustable to achieve varying incident flux on the prototype CPV module 600. During field tests, infrared light not absorbed by the prototype CPV module 600 was transmitted to a thermal receiver 114 behind the prototype CPV module 600. The dish was positioned via its tracker to face the sun throughout the day, irradiating the prototype CPV module 600 and thermal receiver 114 with high-intensity sunlight.

Flux Mapping—A solar flux map is a high-radiation intensity distribution map used to evaluate the performance of a CPV module 600 while under concentration at a given working plane relative to the dish's focal point. A solar flux map can be generated from an image of an illuminated circular diffusely reflective target mounted at the same working plane as the PV cells 406 in the outdoor testbed. The image is then imported into a MATLAB code along with measured direct normal irradiance (DNI) data taken at the time of the image acquisition. By visualizing the target's circular edge, the pixel scale in the image can be calculated using the known diameter of the target. The DNI data is used to calibrate the absolute power flux for all of the pixels in the image. The incident power on the cell region can be obtained by integrating the power flux over the cell array areas.

Figure 15:
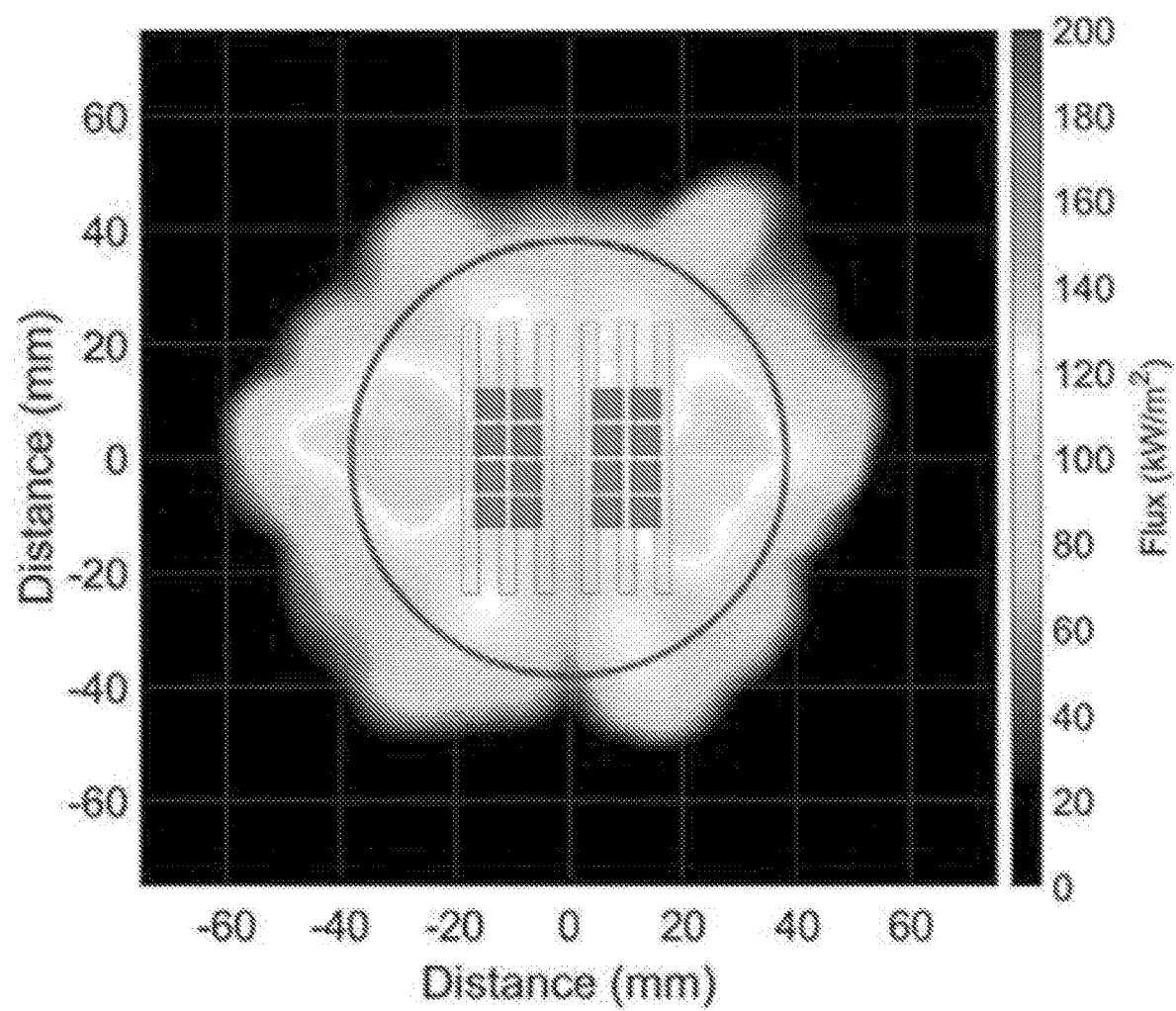
FIG. 15 shows an exemplary solar flux map.

FIG. 15 shows an exemplary solar flux map measured for the prototype CPV module 600 with a 50.45% open area and 518 W window power. In FIG. 15, the solar flux map is overlaid with the cell array layout and the input aperture window of the CPV module 600. The non-uniform distribution of the flux is due to imperfections in the parabolic mirror: reduced flux density in the lower center area results from the shadow of the module support arm (e.g., the support arm 112 in FIGS. 1 and 2) on the mirror. The cell positioning (e.g., the center gap between the second and third columns of PV cells 406) and wiring take these non-idealities into account. It is important to note that the prototype CPV module 600 is a proof-of-concept used to validate the CPV module concept. Future CPV modules 600 may use more PV cells 406 and a larger window aperture to more fully capture incoming solar flux.

Optical Performance—The full solar spectrum transmission through the CPV module 600 determines how much light will reach the thermal receiver 114. Region-specific transmission spectra were measured in the laboratory, as shown in FIG. 13. Combined with spatial flux mapping of the concentrator dish at the module working plane (~63.5 mm inboard of the dish's focal point), the expected transmitted power through the CPV module 600 was predicted. The measured transmitted power was obtained through outdoor tests. In each test, energy collected by the thermal receiver 114 was calculated using the mass flow rate, specific heat capacity of HTF, and temperature difference between outlet and inlet ports of the thermal receiver 114. The thermal receiver 114 was a conical cavity dimple-plate receiver with a capture efficiency of 92% at outlet temperatures up to 250° C.

FIG. 16 is a table of the predicted transmitted power, measured transmitted power, and power lost fractions for different tests of the prototype CPV module 600. The power lost fraction increased from 18.4% to 26.3% over the first two tests. Between the tests on November 25th (the second test in the table) and December 6th (the third test in the table), dirty and compromised HTF was replaced with new silicone oil. With the new silicone oil, the power lost fraction dropped by about 15%. However, the power lost fraction again increased from 11.5% to 18.5% between the third and fourth tests, and became stable over the last four tests. To determine why 18.0% of the power was always lost, the optical transmission of the prototype CPV module 600 was again measured in a laboratory after the outdoor tests were completed.

Figure 17:
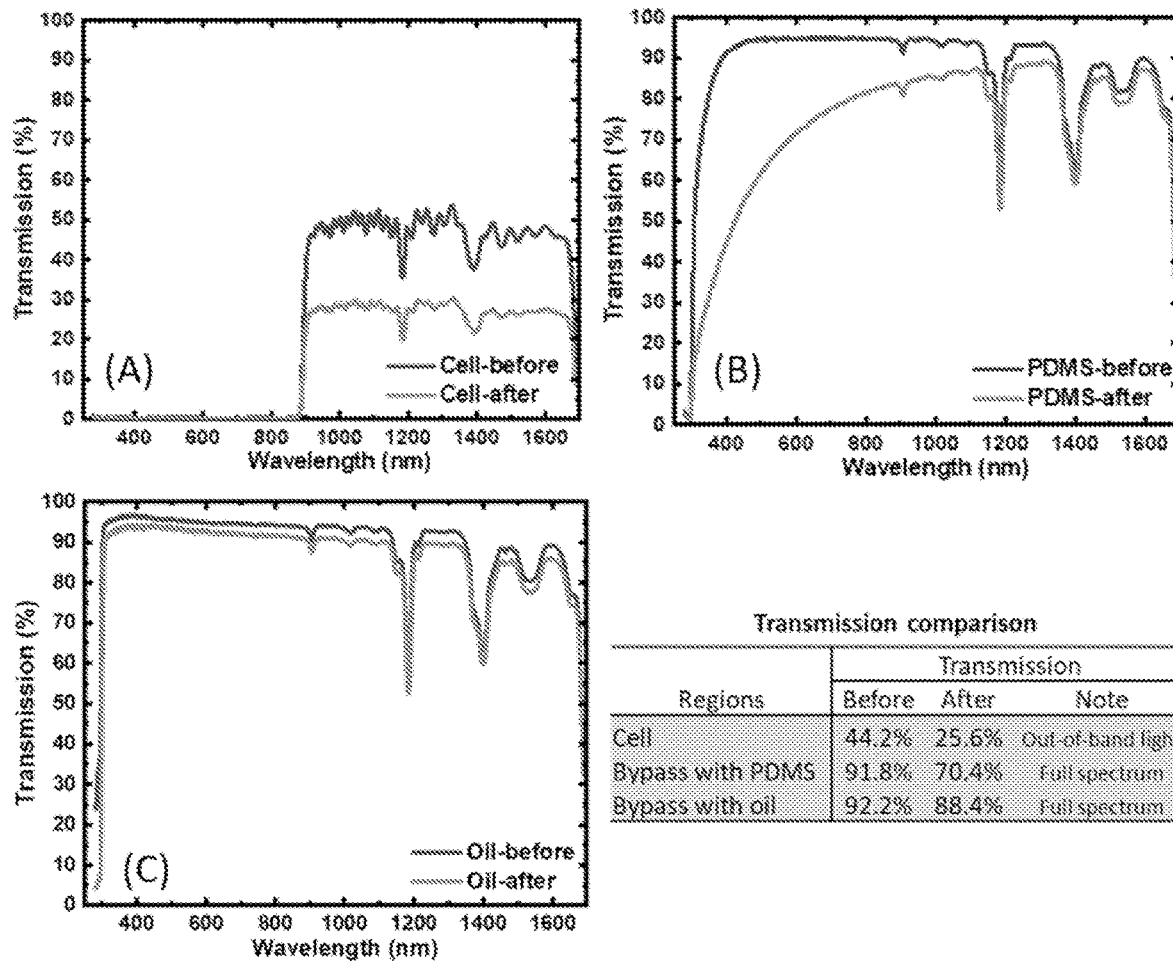
FIG. 17 shows three plots comparing measured transmission spectra through different regions of the prototype CPV module before and after outdoor tests.

FIG. 17 shows three plots comparing measured transmission spectra through different regions of the prototype CPV module 600 before and after the outdoor tests. Each measured spectrum in FIG. 7 is an average over multiple measurement locations. The three regions have less optical transmission, especially the bypass regions with the PDMS silicone elastomer, where the energy-weighted transmission has decreased by about 21%. This is mainly due to UV degradation of the PDMS silicone elastomer under concentrated sunlight. Even though silicone oil and PDMS silicone elastomer share the same chemical structure (i.e., PDMS), the bypass region with silicone is filled with flowing oil, whereas the region with PDMS silicone elastomer is static. This resulted in less thermal damage to the flowing silicone oil. This degradation mechanism may be overcome by altering the geometry of the CPV module 600 to reduce the use of stagnant PDMS silicone elastomer in high-flux zones; these high-flux regions may instead be replaced with more PV cells cooled by flowing silicone oil. The less transmission in the cell region results from the impurity deposition during the cell operation time, which is unavoidable. When the expected power transmitted to the thermal receiver 114 is adjusted with the post-test optical transmission from the three regions, the model and final test results closely match (393 W and 382 W, respectively).

Electrical Performance—Electrical performance was measured using a BK Precision 8514 programmable DC electronic load controlled by custom LabVIEW code. The load performed an I-V sweep on the prototype CPV module 600 every 60 seconds, and calculated the voltage $V_{max}$ at the maximum power point. Between I-V sweeps, the programmable load operated at $V_{max}$, recording power measurements every two seconds.

Figure 18:
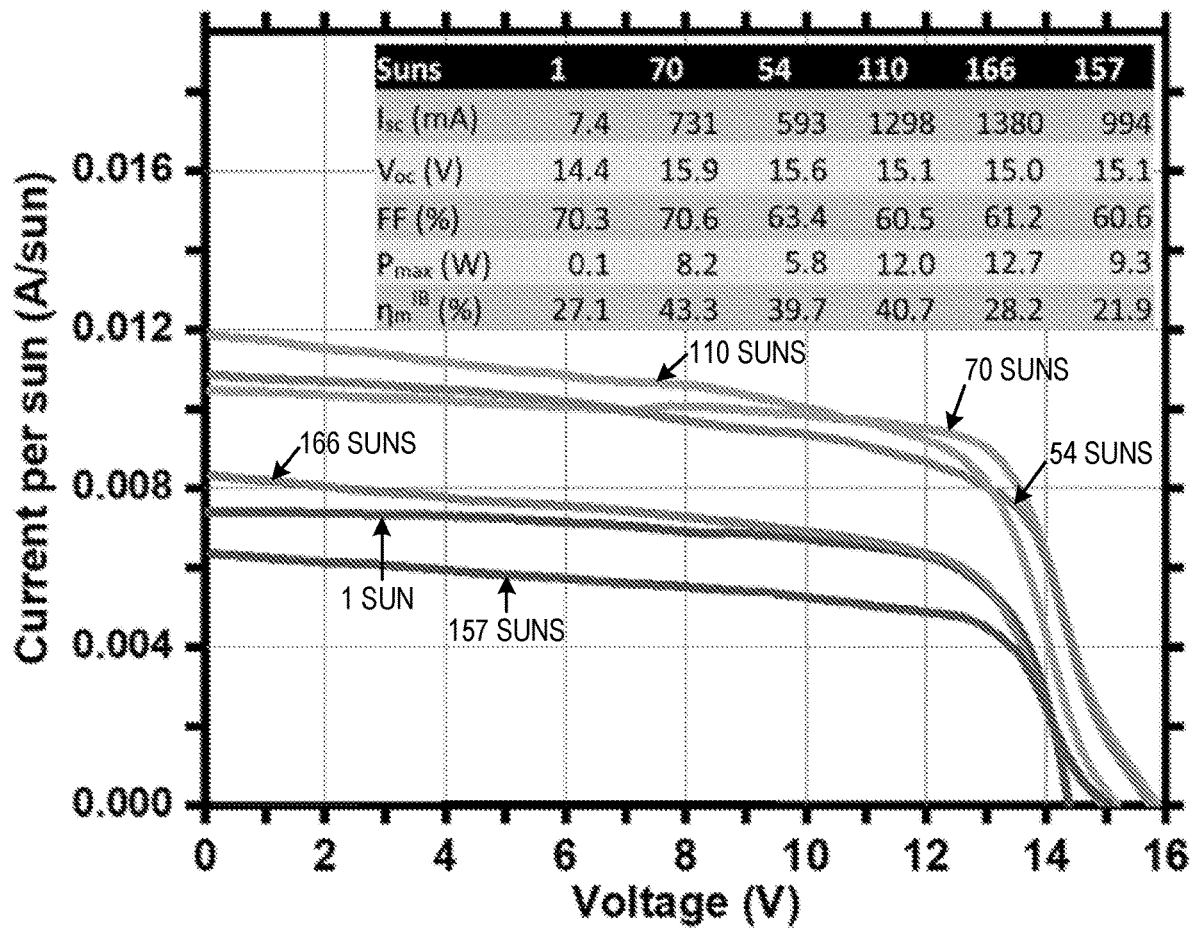
FIG. 18 shows exemplary I-V sweeps measured with the prototype CPV module.

FIG. 18 shows exemplary I-V sweeps measured with the prototype CPV module 600 at solar concentrations between 1 and 166 suns. The x axis is the applied voltage and the y axis is the current-per-sun for each I-V sweep. The short circuit current of 7.4 mA at 1 sun is plotted for reference. The current-per-sun increases with concentration, reaching its highest value of 12 mA/sun at 110 suns, at which point the PV cells 406 are at their optimal operating temperature of 80° C., where maximum current matching between the three junctions is achieved. However, current-per-sun drops in the last two tests (at 166 and 157 suns), as the measured maximum PV-cell temperature reaches 120° C., causing current mismatch within the three subcells. Meanwhile, the fill factor decreases from ~70% to ~60% with almost 10% absolute loss during the outdoor tests due to degradation associated with thermal break-in. The fill factor is more stable in the last three tests. The in-band energy conversion efficiency of the module reached 43.3% at 70 suns.

While inspecting the PV cells 406 in the prototype CPV module 600 after the outdoor testing described above, it was observed that the optical adhesive (Norland Products NOA 86H), which was used to strengthen the bond between copper wires and busbars on the cells, became opaque. This adhesive is UV light cured, and has peak absorption wavelengths at 325, 365, and 400 nm. After curing and aging, it can withstand temperatures up to 125° C. In the last two outdoor tests, the optical transmission of the adhesive diminished due to extensive UV absorption and high PV-cell temperatures that almost hit this limit. This surface adhesive degradation contributed to the reduction in short circuit current in the last two outdoor tests. Hence, the last outdoor test showed the smallest short circuit current-per-sun and the lowest power conversion efficiency. The CPV module 600 may use an alternative wire/busbar solder material with improved adhesion while also utilizing improved fabrication techniques to reduce the cell surface area affected by this bond Cooling Performance—It is critical that the CPV module 600 keep the PV cells 406 working continuously below the maximum operating temperature of 120° C. during on-sun, high-flux operation. Using the flux image taken after each outdoor test, the power distribution can be obtained by integrating the flux density of described above. In the finite-element-analysis simulation described above, each PV cell 406 was treated as a heat source whose power is adding heat energy together from both cells and the HTF.

Figure 19B:
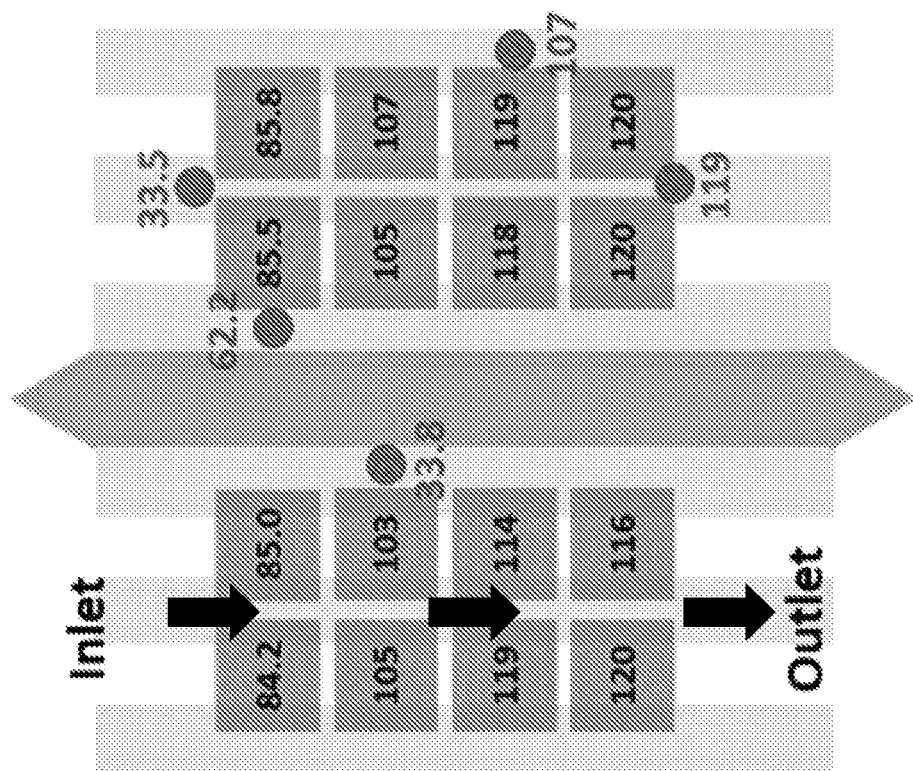
FIGS. 19A-19D show exemplary plots of measured and simulated thermal loads and cooling of the prototype CPV module.
Figure 19A:
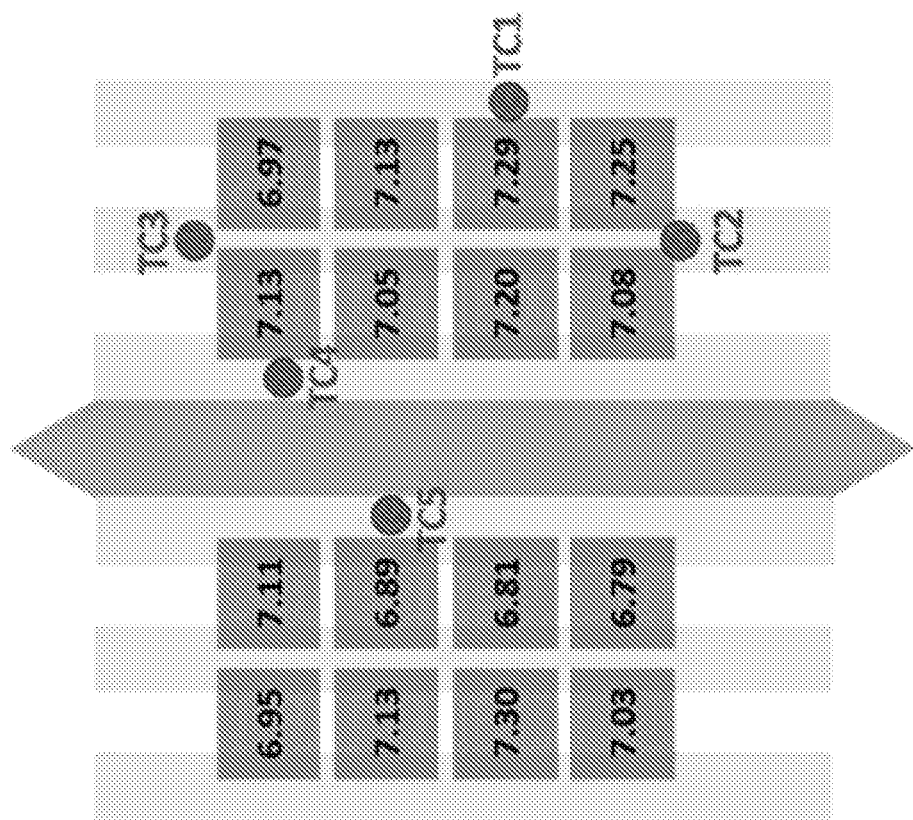

FIGS. 19A-19D show exemplary plots of measured and simulated thermal loads and cooling of the prototype CPV module 600. All of the plots of FIGS. 19A-19D reflect conditions in outdoor testing using measured flux maps with an average concentration of 166 suns and an ambient temperature of 25° C. FIG. 19A shows the thermal power in watts to be extracted from each PV cell 406, and the locations of five thermocouples used to monitor PV-cell temperatures during testing. These five locations are labeled TC1 through TC5. The mass flow rate and the average inlet temperature of the HTF were 10.3 g/s and 20.9° C. in the outdoor test at 166 suns and were set as the initial condition in the COMSOL simulation.

FIG. 19B shows the simulated maximum temperature for each PV cell 406, and the measured average temperature from the five thermocouples. In FIG. 19B, the HTF flows from top to bottom, as indicated by the arrows. In general, the maximum temperature for each PV cell 406 in the same column increases along the flow direction, while the measured temperatures at TC3, TC4, TC1, and TC2 in the right cooling channel, which were 33.5° C., 62.2° C., 107° C., and 119° C., respectively, show the same trend. TC2 is placed between the two PV cells 406 at the end of the right cooling channel. Its measured temperature is 119° C., which is within 1° C. of the simulated temperature of the two PV cells 406 nearby.

Figure 19D:
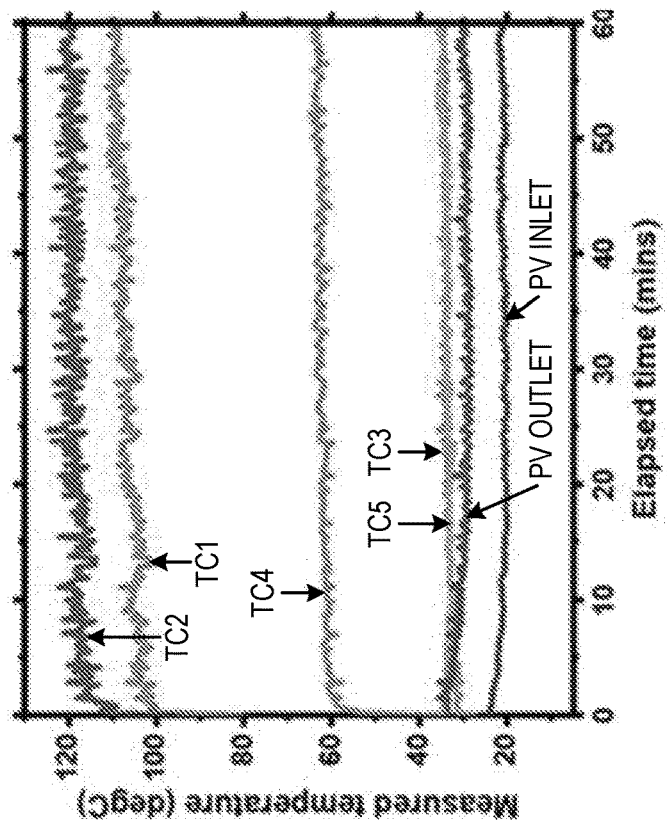
Figure 19C:
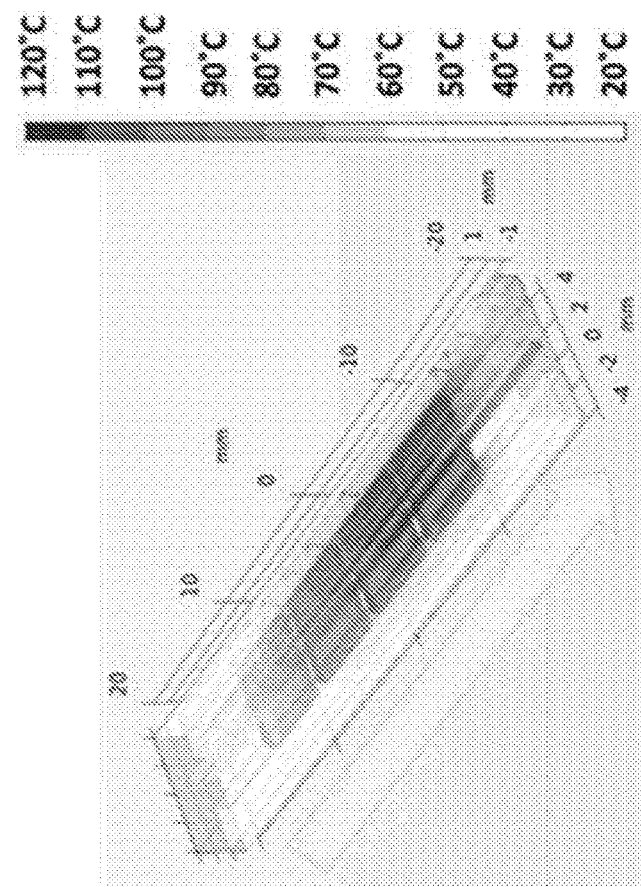

FIG. 19C show an exemplary modeled temperature contour plot for one column of PV cells 406. In this example, the one column considered was the third column from the left. The HTF flows across both sides of the PV cells 406. The temperature drop is larger between the PV cells 406 and the silicone oil than within the PV cells 406 themselves, and thermocouple measurement is thus sensitive to the distance from the PV cells 406 to measured locations, which accounts for some thermocouples more closely matching the expected nearby PV-cell temperatures than others.

FIG. 19D is an exemplary plot of real-time measured temperatures throughout the prototype CPV module 600 during the 166-sun outdoor test. The measured and simulated outlet temperatures of the silicone oil HTF closely match at 29.8° C. and 30.4° C., respectively.

System Efficiency Analysis

FIG. 20 is a table summarizing performance of the prototype CPV module 600 over seven outdoor tests, including power collected by the PV cooling system, PV cells 406, and thermal receiver 114. The total power fraction captured (as 56.0% of solar flux incident on the module aperture window) was less than 100%, with lost power mainly caused by surface reflection off the prototype CPV module 600, light absorption in the bypass region with PDMS silicone elastomer, and thermal radiation loss in the thermal receiver 114. The power fraction of the PV cells 406 dropped over the testing campaign because of the optical adhesive degradation and HTF contamination, both of which may readily be addressed in future modules, as described above. The power fraction of the PV cooling increased markedly from test 1 to test 2, resulting from more light absorption in the contaminated HTF, which leads to less light transmitted to the thermal receiver 114. After replacing the HTF prior to the test on Dec. 6, 2019, the PV cooling fraction dropped as expected. The last four tests showed consistent and stable overall performance, with total the power fraction holding steady around 86%.

In some embodiments, the PDMS layer is replaced by additional PV cells 406. These embodiments increase the total electrical power generated while removing PDMS that degrades upon absorbing UV light at high concentrations. In some embodiments, the silicone oil is kept in a closed loop, as opposed to an open loop, thereby avoiding contamination. In some embodiments, the optical adhesive used to mechanically affix wires to the PV-cell busbars is replaced by a more robust attachment mechanism. For example, SnPd solder and silver wires may improve the mechanical performance of these bonds.

While the above results show that the silicone oil can cool PV cells 406 at average concentrations as high as 166 suns while maintaining PV-cell temperature below 120° C., only 3% (maximum) of incident light was converted into electrical power. To convert a larger fraction of the incident light, the window aperture diameter can be increased (e.g., from 75 mm to 143 mm) to integrate more PV cells 406. A larger aperture also allows more light from the dish 102 to strike the superstrate 604, minimizing light spillage onto the upper annular collar 602. More PV cells 406 also increase the electrical power fraction, but should be designed to avoid increased series resistance and minimize the risk of the PV cells 406 from overheating.

Combination of Features

Features described above as well as those claimed below may be combined in various ways without departing from the scope hereof. The following examples illustrate possible, non-limiting combinations of features and embodiments described above. It should be clear that other changes and modifications may be made to the present embodiments without departing from the spirit and scope of this invention:

(A1) A spectrum splitting concentrator photovoltaic (CPV) module may include a plurality of photovoltaic cells, each of the plurality of photovoltaic cells having a front face and a rear face. The photovoltaic module may also include a plurality of supports, the rear face of each of the plurality of photovoltaic cells being affixed to two of the plurality of supports. The photovoltaic module may also include a plurality of co-planar spacers forming a fluid channel, the plurality of supports and the plurality of photovoltaic cells being located within the fluid channel. The heat transfer fluid, when flowing through the fluid channel, may directly contact the front face and at least part of the rear face of each of the plurality of photovoltaic cells.

(A2) In the spectrum splitting CPV module denoted (A1), each photovoltaic cell of the plurality of photovoltaic cells may be affixed to two of the plurality of supports near two opposite edges of said each photovoltaic cell such that heat transfer fluid, when flowing through the fluid channel, directly contacts a center of the rear face of each photovoltaic cell.

(A3) In the spectrum splitting CPV module denoted (A2), the two opposite edges may be parallel to a flow direction of the fluid channel.

(A4) In any one of the spectrum splitting CPV modules denoted (A1) to (A3), each of the plurality of supports may be formed of quartz or fused silica.

(A5) In any one of the spectrum splitting CPV modules denoted (A1) to (A4), all of the plurality of co-planar spacers may have a similar thickness to define an upper plane and a lower plane of the fluid channel. In addition, the front face of each of the plurality of photovoltaic cells may be located below the upper plane, and the rear face of each of the plurality of photovoltaic cells may be located above the lower plane.

(A6) In the spectrum splitting CPV module denoted (A5), the spectrum splitting CPV module may further include a transmissive superstrate having a bottom surface directly contacting top faces of plurality of spacers to form an upper wall of the fluid channel, and a transmissive substrate having a top surface directly contacting bottom faces of the plurality of spacers to form a lower wall of the fluid channel.

(A7) In the spectrum splitting CPV module denoted (A6), each of the transmissive superstrate and the transmissive substrate may be formed of quartz or fused silica.

(A8) In either one of the spectrum splitting CPV modules denoted (A6) and (A7), the spectrum splitting CPV module may further include an upper annular collar and a lower annular collar joined together to form a sealed cavity. The transmissive superstrate, the transmissive substrate, the plurality of photovoltaic cells, the plurality of supports, and the plurality of co-planar spacers may be located within the sealed cavity such that light can pass through the transmissive superstrate to illuminate the front face of each of the plurality of photovoltaic cells, and light not absorbed by the plurality of photovoltaic cells can pass through the transmissive substrate.

(A9) In any one of the spectrum splitting CPV modules denoted (A1) to (A8), the plurality of photovoltaic cells may be arranged in a one-dimensional array extending along a flow direction of the fluid channel.

(A10) In any one of the spectrum splitting CPV modules denoted (A1) to (A9), each of the plurality of photovoltaic cells may be a III-V multijunction cell.

(B1) A spectrum splitting CPV module may include a plurality of photovoltaic-cell arrays, each of the plurality of photovoltaic-cell arrays including a plurality of photovoltaic cells and a plurality of supports, each of the plurality of photovoltaic cells being affixed to two of the plurality of supports. The photovoltaic module may also include a plurality of spacers forming a plurality of fluid channels, each of the plurality of photovoltaic-cell arrays being located within a corresponding one of the plurality of fluid channels. Cooling fluid, when flowing through the plurality of fluid channels, may directly contact a front face and at least part of a rear face of each of the plurality of photovoltaic cells.

(B2) In the spectrum splitting CPV module denoted (B1), the plurality of fluid channels may have a corresponding plurality of flow directions that are parallel to each other.

(B3) In either one of the spectrum splitting CPV modules denoted (B1) and (B2), the plurality of photovoltaic cells in each of the plurality of photovoltaic-cell arrays may be arranged in a one-dimensional array extending along a flow direction of the corresponding one of the plurality of fluid channels.

(B4) In any one of the spectrum splitting CPV modules denoted (B1) to (B3), all of the plurality of photovoltaic cells in all of the plurality of photovoltaic-cell arrays may be arranged in a two-dimensional array.

(B5) In the spectrum splitting CPV module denoted (B4), the two-dimensional array may be symmetric about a centerline of the spectrum splitting CPV module.

(C1) A method for solar power conversion may include supporting a plurality of photovoltaic cells within one or more fluid channels, and converting sunlight into electrical power when the sunlight illuminates a front face of each the plurality of photovoltaic cells. The method may also include cooling the plurality of photovoltaic cells by flowing heat transfer fluid through the one or more fluid channels such that heat transfer fluid directly contacts the front face and at least part of a rear face of each of the plurality of photovoltaic cells.

(C2) In the method denoted (C1), the method may further include transmitting through the heat transfer fluid: (a) sunlight transmitted through the plurality of photovoltaic cells, and (b) sunlight transmitted between the plurality of photovoltaic cells. The method may further include converting transmitted sunlight into thermal energy using a thermal receiver.

(C3) In either one of the methods denoted (C1) and (C2), said supporting may include supporting each of the plurality of photovoltaic cells near two opposite edges such that heat transfer fluid directly contacts a center of the rear face of each of the plurality of photovoltaic cells.

(C4) In the method denoted (C3), the two opposite edges may be parallel to a flow direction of the heat transfer fluid.

(C5) In any one of the methods denoted (C1) to (C4), the one or more fluid channels may have a corresponding one or more flow directions that are parallel to each other.

(C6) In any one of the methods denoted (C1) to (C5), each of the plurality of photovoltaic cells may be a III-V multijunction cell.

(C7) In any one of the methods denoted (C1) to (C6), the plurality of photovoltaic cells may be arranged in a symmetric two-dimensional array.

(C8) In any one of the methods denoted (C1) to (C7), the heat transfer fluid may be silicone oil.

(C9) In any one of the methods denoted (C1) to (C8), the heat transfer fluid may have a viscosity less than or equal to 100 cP.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A spectrum splitting concentrator photovoltaic (CPV) module, comprising:
a transmissive substrate having a top surface;
a plurality of photovoltaic cells, each of the plurality of photovoltaic cells having a front face and a rear face;
a plurality of supports on the top surface, the rear face of each of the plurality of photovoltaic cells being affixed to two of the plurality of supports; and
a plurality of spacers, each having a spacer height and a respective bottom face on the top surface, and forming a fluid channel having a height defined by the spacer height, the plurality of supports and the plurality of photovoltaic cells being located within the fluid channel;
wherein heat transfer fluid, when flowing through the fluid channel, directly contacts the front face and at least part of the rear face of each of the plurality of photovoltaic cells.

2. The spectrum splitting CPV module of claim 1, each photovoltaic cell of the plurality of photovoltaic cells being affixed to two of the plurality of supports near two opposite edges of the photovoltaic cell such that heat transfer fluid, when flowing through the fluid channel, directly contacts a center of the rear face of the photovoltaic cell.

3. The spectrum splitting CPV module of claim 2, the two opposite edges being parallel to a flow direction of the fluid channel.

4. The spectrum splitting CPV module of claim 1, each of the plurality of supports being formed of quartz or fused silica.

5. The spectrum splitting CPV module of claim 1,
all of the plurality of spacers having a similar thickness to define an upper plane and a lower plane of the fluid channel;
the front face of each of the plurality of photovoltaic cells being located below the upper plane; and
the rear face of each of the plurality of photovoltaic cells being located above the lower plane.

6. The spectrum splitting CPV module of claim 5, further comprising:
a transmissive superstrate having a bottom surface on top faces of plurality of spacers to form an upper wall of the fluid channel; and
the transmissive substrate forming a lower wall of the fluid channel.

7. The spectrum splitting CPV module of claim 6, each of the transmissive superstrate and the transmissive substrate being formed of quartz or fused silica.

8. The spectrum splitting CPV module of claim 6,
further comprising an upper annular collar and a lower annular collar joined together to form a sealed cavity;
the transmissive superstrate, the transmissive substrate, the plurality of photovoltaic cells, the plurality of supports, and the plurality of spacers being located within the sealed cavity such that light can pass through the transmissive superstrate to illuminate the front face of each of the plurality of photovoltaic cells, and light not absorbed by the plurality of photovoltaic cells can pass through the transmissive substrate.

9. The spectrum splitting CPV module of claim 1, the plurality of photovoltaic cells being arranged in a one-dimensional array extending along a flow direction of the fluid channel.

10. The spectrum splitting CPV module of claim 1, each of the plurality of photovoltaic cells being a III-V multi-junction cell.

11. A spectrum splitting concentrator photovoltaic (CPV) module, comprising:
a transmissive substrate having a top surface;
a plurality of spacers forming a fluid channel, each of the plurality of spacers having (i) a respective bottom face on the top surface and (ii) a side that establishes a sidewall of the fluid channel;
a plurality of photovoltaic cells located within the fluid channel, each of the plurality of photovoltaic cells having a front face and a rear face; and
a plurality of supports on the top surface, within the fluid channel, and between two of the plurality of spacers, the rear face of each of the plurality of photovoltaic cells being affixed to two of the plurality of supports;
wherein heat transfer fluid, when flowing through the fluid channel, directly contacts the front face and at least part of the rear face of each of the plurality of photovoltaic cells.

* * * * *